(12) United States Patent
Glancy et al.

(10) Patent No.: US 10,090,065 B1
(45) Date of Patent: Oct. 2, 2018

(54) SIMULTANEOUS WRITE, READ, AND COMMAND-ADDRESS-CONTROL CALIBRATION OF AN INTERFACE WITHIN A CIRCUIT

(71) Applicant: INTERNATIONAL BUSINESS MACHINES CORPORATION, Armonk, NY (US)

(72) Inventors: Stephen P. Glancy, Poughkeepsie, NY (US); Jeremy R. Neaton, Fishkill, NY (US); Gary A. Van Huben, Poughkeepsie, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 15/458,965

(22) Filed: Mar. 14, 2017

(51) Int. Cl.
  *G11C 29/50* (2006.01)
  *G11C 7/22* (2006.01)
  *G11C 8/18* (2006.01)
  *G11C 29/52* (2006.01)

(52) U.S. Cl.
  CPC .......... *G11C 29/50012* (2013.01); *G11C 7/22* (2013.01); *G11C 8/18* (2013.01); *G11C 29/52* (2013.01)

(58) Field of Classification Search
  CPC ..... G11C 29/50012; G11C 29/52; G11C 7/22; G11C 8/18
  See application file for complete search history.

(56) References Cited

U.S. PATENT DOCUMENTS

| | | | |
|---|---|---|---|
| 6,079,038 | A  | 6/2000  | Huston et al. |
| 6,876,207 | B2 | 4/2005  | Hass et al. |
| 7,107,476 | B2 | 9/2006  | Jeong et al. |
| 7,133,790 | B2 | 11/2006 | Liou et al. |
| 7,321,991 | B2 | 1/2008  | An |
| 7,701,801 | B2 | 4/2010  | Joshi et al. |
| 7,865,660 | B2 | 1/2011  | Guo et al. |

(Continued)

FOREIGN PATENT DOCUMENTS

| | | |
|---|---|---|
| CN | 102006091  | 4/2011 |
| CN | 102916759  | 2/2013 |
| JP | 2014229335 | 12/2014 |

OTHER PUBLICATIONS

Freescale Semiconductor, Inc., "I.MX 6 Series DDR Calibration", Document No. AN4467, Rev. 2, Mar. 2015, 50 Pages.

(Continued)

*Primary Examiner* — Ajay Ojha

(74) *Attorney, Agent, or Firm* — Amy Bortnick; Amy J. Pattillo

(57) ABSTRACT

A calibration controller tests an electronic circuit to identify an initial read check with a read delay, an initial write check with a write delay, and an initial command, address, control (CAC) check with a CAC delay indicated as passing. Responsive to the initial read check, the initial write check, and the initial CAC check indicated as passing, for each setting of the read delay, the write delay, and the CAC delay, the calibration controller iteratively performs concurrently, a write test with the write delay, a read test with the read delay, and a CAC test with the CAC delay on the electronic circuit over the range of conditions while simultaneously adjusting the write delay, the read delay, and the CAC delay for each iteration until one or more of a read edge, a write edge, and a CAC edge are detected.

20 Claims, 11 Drawing Sheets

(56) References Cited

U.S. PATENT DOCUMENTS

| | | |
|---|---|---|
| 8,286,044 B2 | 10/2012 | Foster, Sr. et al. |
| 8,565,033 B1 | 10/2013 | Manohararajah et al. |
| 8,659,959 B2 | 2/2014 | Kim et al. |
| 8,693,246 B2 | 4/2014 | Roohparvar et al. |
| 9,401,197 B2 | 7/2016 | Jeon et al. |
| 2006/0164909 A1 | 7/2006 | Gower et al. |
| 2009/0031091 A1 | 1/2009 | Chang et al. |
| 2009/0161453 A1 | 6/2009 | Giovannini et al. |
| 2010/0146237 A1 | 6/2010 | Takai |
| 2010/0188919 A1 | 7/2010 | Fox et al. |
| 2011/0222358 A1 | 9/2011 | Ware |
| 2011/0258475 A1 | 10/2011 | Lee et al. |
| 2014/0016404 A1 | 1/2014 | Kim et al. |
| 2014/0046466 A1 | 2/2014 | Bickford et al. |
| 2014/0185384 A1 | 7/2014 | Kim et al. |
| 2014/0189224 A1 | 7/2014 | Kostinsky et al. |
| 2014/0328132 A1 | 11/2014 | Cordero et al. |
| 2016/0209866 A1 | 7/2016 | Jeter et al. |
| 2017/0270994 A1 | 9/2017 | Glancy et al. |

OTHER PUBLICATIONS

Lee et al, "25.2 A 1.2 V 8Gb 8-channel 128GB/s high-bandwidth memory (HBM) stacked DRAM with effective microbump I/O test methods using 29nm process and TSV", 2014 IEEE International Solid-State Circuits Conference Digest of Technical Papers (ISSCC), Feb, 12, 2014, pp. 432-433, 3 pages.

"System and Method for Performance Optimized Periodic Memory Calibration", IP.com, IPCOM000225341D, Feb. 11, 2013, 5 pages.

DQ I/O, Altera Corporation, 2005-2015, accessed via the Internet from <http://quartushelp.altera.com/15.0/mergedProjects/reference/glossary/def_dq_io.htm> as of Feb. 7, 2017, 1 page.

Office Action, dated Sep. 8, 2017, U.S. Appl. No. 15/071,203, filed Mar. 16, 2016, In re Glancy, 42 pages.

Notice of Allowance, dated Jan. 12, 2018, U.S. Appl. No. 15/071,203, filed Mar. 16, 2016, in re Glancy, 48 pages.

Notice of Allowance, dated May 3, 2018, U.S. Appl. No. 15/071,203, filed Mar. 16, 2016, in re Glancy, 31 pages.

| ID 410 | TOTAL TEST RESULT 412 | WR 414 | CAC 416 | RD 418 |
|---|---|---|---|---|
| 0 | P | P | P | P |
| 1 | F | P | P | F |
| 2 | F | P | F | P |
| 3 | F | P | F | F |
| 4 | F | F | P | P |
| 5 | F | F | P | F |
| 6 | F | F | F | P |
| 7 | F | F | F | F |

US 10,090,065 B1

SIMULTANEOUS WRITE, READ, AND COMMAND-ADDRESS-CONTROL CALIBRATION OF AN INTERFACE WITHIN A CIRCUIT

BACKGROUND

1. Technical Field

This invention relates in general to a memory system calibration and more particularly to simultaneous write, read, and command-address-control (CAC) calibration of an interface within a circuit.

2. Description of the Related Art

Computing systems generally include one or more circuits with one or more memory or storage devices connected to one or more processors via one or more controllers. Timing variations, frequency, temperature, aging, and other conditions impact data transfer rates to and from memory or other storage, which impacts computer system performance, and reliability. As operating frequencies increase, the valid window for read signals, write signals, and CAC signals to be latched within decreases. Given the high clock rates and fast edge speed used in many computer systems, timing variations and timing skews from one system implementation to another are challenging and time consuming to calibrate, especially for systems with larger amounts of memory and a greater overall width of the memory bus.

BRIEF SUMMARY

In one embodiment, a method is directed to testing an electronic circuit to identify an initial read check with a read delay, an initial write check with a write delay, and an initial command, address, control (CAC) check with a CAC delay indicated as passing. The method is directed to, responsive to the initial read check, the initial write check, and the initial CAC check indicated as passing, for each setting of the read delay, the write delay, and the CAC delay, iteratively performing concurrently, a write test with the write delay, a read test with the read delay, and a CAC test with the CAC delay on the electronic circuit over a plurality of types of conditions while simultaneously adjusting the write delay, the read delay, and the CAC delay for each iteration of a plurality of iterations of the concurrent read test, write test, and CAC test until one or more of a read edge, a write edge, and a CAC edge are detected.

In another embodiment, a computer system comprises one or more processors, one or more computer-readable memories, one or more computer-readable storage devices, and program instructions, stored on at least one of the one or more storage devices for execution by at least one of the one or more processors via at least one of the one or more memories. The stored program instructions comprise program instructions to test an electronic circuit to identify an initial read check with a read delay, an initial write check with a write delay, and an initial CAC check with a CAC delay indicated as passing. The stored program instructions comprise program instructions to, responsive to the initial read check, the initial write check, and the initial CAC check indicated as passing, for each setting of the read delay, the write delay, and the CAC delay, iteratively perform concurrently, a write test with the write delay, a read test with the read delay, and a CAC test with the CAC delay on the electronic circuit over a plurality of types of conditions while simultaneously adjusting the write delay, the read delay, and the CAC delay for each iteration of a plurality of iterations of the concurrent read test, write test, and CAC test until one or more of a read edge, a write edge, and a CAC edge are detected.

In another embodiment, a computer program product comprises one or more computer-readable storage devices and program instructions, stored on at least one of the one or more storage devices. The stored program instructions comprise program instructions to test an electronic circuit to identify an initial read check with a read delay, an initial write check with a write delay, and an initial CAC check with a CAC delay indicated as passing. The stored program instructions comprise program instructions to, responsive to the initial read check, the initial write check, and the initial CAC check indicated as passing, for each setting of the read delay, the write delay, and the CAC delay, iteratively perform concurrently, a write test with the write delay, a read test with the read delay, and a CAC test with the CAC delay on the electronic circuit over a plurality of types of conditions while simultaneously adjusting the write delay, the read delay, and the CAC delay for each iteration of a plurality of iterations of the concurrent read test, write test, and CAC test until one or more of a read edge, a write edge, and a CAC edge are detected.

BRIEF DESCRIPTION OF THE SEVERAL VIEWS OF THE DRAWINGS

The novel features believed characteristic of one or more embodiments of the invention are set forth in the appended claims. The one or more embodiments of the invention itself however, will best be understood by reference to the following detailed description of an illustrative embodiment when read in conjunction with the accompanying drawings, wherein:

DETAILED DESCRIPTION

In the following description, for the purposes of explanation, numerous specific details are set forth in order to provide a thorough understanding of the present invention. It will be apparent, however, to one skilled in the art that the present invention may be practiced without these specific details. In other instances, well-known structures and devices are shown in block diagram form in order to avoid unnecessarily obscuring the present invention.

In addition, in the following description, for purposes of explanation, numerous systems are described. It is important to note, and it will be apparent to one skilled in the art, that the present invention may execute in a variety of systems, including a variety of computer systems and electronic devices operating any number of different types of operating systems.

Figure 1:
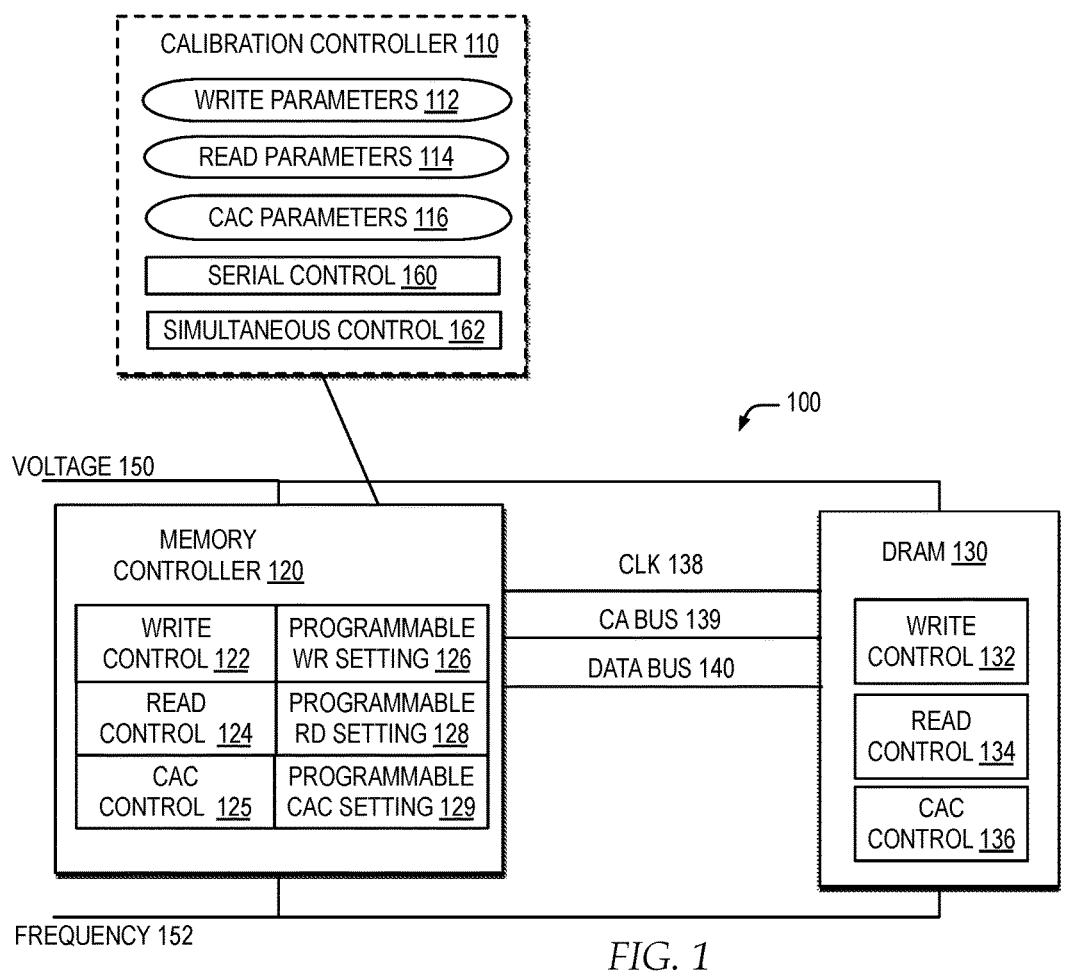
FIG. 1 is a block diagram of one example of an electronic circuit including a calibration controller for managing simultaneous write, read, and CAC calibration of an interface within the electronic circuit.

FIG. 1 illustrates a block diagram of one example of an electronic circuit including a calibration controller for managing simultaneous write, read, and CAC calibration of an interface within the electronic circuit.

In the example, an electronic circuit 100 includes multiple circuit elements, including, but not limited to, a memory controller 120 and a dynamic random-access memory (DRAM) 130 directly coupled to one another through one or more types of connections. In one example, the one or more types of connections may include, for example, a clock (CLK) signal 138, a command, address, and control (CA) bus 139 for passing settings from command, address, and control pins, a data bus 140 for passing data from data pins. In one example, electronic circuit may include additional or alternate connections between memory controller 120 and DRAM 130. In one example, memory controller 120 and DRAM 130 may represent a memory module, such as a SIMM or a DIMM. DRAM 130 may generally include one or more types of memory including, but not limited to dynamic random access memory (DRAM), static random access memory (SRAM), and electrically erasable programmable read-only memory (EEPROM), and other types of non-volatile memories.

In addition, in one example, memory controller 120 and DRAM 130 may represent other types of circuit elements, including, but not limited to, a processor chip with direct attach memory and a storage controller chip. Electronic circuit 100 may represent an integrated circuit (IC), an application specific IC (ASIC), or a microprocessor. In additional or alternate examples, electronic circuit 100 may represent any type of system that transmits data bi-directionally or uni-directionally between a controller and a chip. In addition, in additional or alternate examples, memory controller 120 may connect with and control more than one DRAM and may include a data buffer communicatively connected between memory controller 120 and the multiple DRAM for selectively buffering communications to and from memory controller 120 via data bus 140 to manage inputs to and outputs from memory controller 120 and each of the DRAM.

In one example, CA bus 139 and data bus 140 may each generally include any type of communication channel, which can be used to transmit signals and data between memory controller 120 and memory. As illustrated in FIG. 1, CA bus 139 and data bus 140 may represent bidirectional channels which may include a write interface to transmit write commands and data from a write control 122 of memory controller 120 to a write control 132 of DRAM 130, a read interface to transmit read commands and data from read control 134 of DRAM 130 to read control 124 of memory controller 120, and a CAC control interface to transmit command, address and control signals through CA bus 139 and data along data bus 140 to CAC control 136 of DRAM 130 and to read data signals passed on data bus 140 for data placed on data pins by DRAM 130 in response to the command, address, and control pattern In one example, each of write control 122, read control 124, CAC control 125, write control 132, read control 134, and CAC control 136 may represent different combinations of hardware elements and different types of transmitters and receivers.

In one example, each of memory controller 120 and DRAM 130 may include multiple input interfaces. In one example, one input interface of each of memory controller 120 and DRAM 130 receives a voltage 150. In another example, another input interface of each of memory controller 120 and DRAM 130 receives a frequency 152. In one example, the settings of each of voltage 150 and frequency 152 may be dynamically adjustable.

In one example, electronic circuit 100 may operate over a range of one or more types of conditions. In one example, examples of the range of one or more types conditions at which electronic circuit 100 operates may include, but are not limited to, a range of voltage settings of voltage 150, a range of frequency settings of frequency 152, a range of timing parameters, a range of driver impedances, a range of receiver impedances, and a range of temperature refresh rates. In one example, the range of voltage settings of voltage 150 may refer to a range of reference voltage settings and a range of slew rates. In additional or alternate embodiments, reference voltage settings may be separately set for each of the write and read reference voltage settings of voltage 150. Additional conditions that may impact operation may include timing, aging, and temperature. In additional or alternate examples, electronic circuit 100 may be impacted by additional or alternate types of conditions and one or more ranges of each type of condition.

In one example, the performance of electronic circuit 100 may be impacted by the range of conditions under which electronic circuit 100 operates and the silicon process used to manufacture electronic circuit 100. In one example, there may be a particular set of parameters for a particular set of conditions that allow for optimized operation within electronic circuit 100, however, in practice, electronic circuit 100 will operate under a range of conditions and requires calibration of one or more programmable, configurable settings within electronic circuit for the specific configuration of elements within electronic circuit 100. For example, as operating frequencies increase, the valid window for signals to be latched within decreases. To ensure optimal calibration, calibrations may need to be done to adjust signal delays so the signals all arrive within the valid window for latching at the optimal time. As valid windows for signals to be latched decreases, this further increases the need to accurately calibrate electronic circuit 100 so that signals arrive within the narrowed valid window. In addition, as electronic circuit 100 operates, and temperature and other conditions cause timing skews, operation of electronic circuit 100 within the optimized parameters requires continued calibration of one or more programmable, configurable settings within electronic circuit.

In particular, the timing of write commands and data, read commands and data, and CAC commands and data on CAC bus 139 and data bus 140 arriving within valid windows within the external interface between memory controller 120 and DRAM 130, impacts the performance of electronic circuit 100. In one example, to manage performance of electronic circuit 100, a calibration controller 110 of memory controller 110 may specify a set of write parameters 112 set for write operations and write data, a set of read parameters 114 set for read operations and read data, and a set of CAC parameters 116 set for command, address, and control operations on CA bus 139, and which may also include both write data and read data on data bus 140. Write parameters 112 may indicate latencies and windows of time acceptable for write data on the external interface of data bus 140. Read parameters 114 may indicate latencies and windows of time acceptable for read data on the external interface of data bus 140. CAC parameters 116 may indicate latencies and windows of time acceptable for writing data for command, access, and control signals on the external interface of data bus 140 and latencies and windows of time acceptable for reading DQ pin or strobe pin data, which may indicate CA parity, from a selection of one or more pins on the external interface of data bus 140. When the timing of write data packets falls outside the edges, horizontally or vertically, of acceptable windows of time within write parameters 112, read data packets fall outside the edges, horizontally or vertically, of acceptable windows of time within read parameters 114, or write data, incoming strobe pin, or read data signals fall outside the edges, horizontally or vertically, of acceptable windows of time within CAC parameters 116, the performance of electronic circuit 100 may diminish or fail. In one example, write parameters 112, read parameters 114, and CAC parameters 116 are separate sets of parameters that are unrelated to one another and are impacted by different sets of circuitry within write, read, and CAC interfaces and controls.

In one example, to configure data bus 140 such that write data latencies meet write parameters 112, read data latencies meet read parameters 114, and CAC latencies meet CAC parameters 116, across ranges of conditions, each of the write interface, the read interface, and the CAC interface may be separately tunable by calibration controller 110. In one example, read data latencies on CA bus 139 and data bus 140 are tunable through setting a programmable RD setting 128 for the read interface. In one example, write data latencies on CA bus 139 and data bus 140 are tunable through setting a programmable WR setting 126 for the write interface. In one example, CAC latencies on CA bus 139 and data bus 140 are tunable through setting a programmable CAC setting 128. In one example, each of programmable RD setting 128, programmable WR setting 126, and programmable CAC setting 129 may include multiple types of configurable settings including, but not limited to, time delay settings and voltage reference (VREF) settings.

In one example, to tune the write timing on data bus 140, a timing delay setting of programmable WR setting 126 may be set to selectively delay the timing of data output from write control 122 onto data bus 140. In one example, to tune the read timing on data bus 140, a timing delay setting of programmable RD setting 128 may selectively delay the timing of data received as input from data bus 140 to read control 124. In one example, to tune the timing on CA bus 139, a timing delay setting of programmable CAC setting 128 may selectively delay the timing of commands and addresses onto CA bus 139, may selectively delay the timing of writing data to data bus 140, and may selectively delay the timing of data response reads from data bus 140. In particular, in one example, a core clock element may run to each of the components within memory controller 120, such as CLK 138, wherein programmable WR setting 126 separately delays the core clock element that runs to write control 122, programmable RD setting 128 separately delays the core clock element that runs to read control 124, and programmable CAC setting 129 separately delays the core clock element that runs to CAC control 125. While in the example memory controller 120 includes a separate write control 122, read control 124, and CAC control 125, in additional or alternate embodiments, CAC control 125 may be integrated into write control 122 and read control 124.

In one example, to center the VREF for write data on data bus 140, programmable WR setting 126 may also be configured to separately control a VREF for the write interface of data bus 140 to write control 122. In one example, to center the VREF for read operations on data bus 140, programmable RD setting 128 may also be configured to separately control a VREF for the read interface of data bus 140 to read control 140. In one example, to center the VREF for CAC settings on CA bus 139 and data bus 140, programmable CAC settings 128 may also be configured to separately control a VREF from the CAC interface of CA bus 139 and data bus 140 to CAC control 125. In one example, to configure the VREF for within each of programmable WR setting 126, programmable RD setting 128, and programmable CAC setting 129, one or more values may be specified in order to center the voltage reference level between the limits of the TTL output swing, such as by setting resistor levels.

In one example, each of programmable WR setting 126, programmable RD setting 128, and programmable CAC setting 129 may be set manually or may be set dynamically by a calibration controller 110 prior to and during operations of memory controller 120. In one example, one or more functions of calibration controller 110 may be performed by firmware or software that runs on electronic circuit 100. In another example, one or more functions of calibration controller 110 may be performed by a tester controller external to electronic circuit 100 that is connected to electronic circuit 100. In another example, one or more functions of calibration controller 110 may be a hardware element of electronic circuit 100 within memory controller 120 or DRAM 130 or as an independent component within electronic circuit 100. In addition, one or more functions of calibration controller 110 may be distributed across a combination of hardware and software elements within electronic circuit 100 and external to electronic circuit 100.

In addition, for running tests on electronic circuit 100, in one example, calibration controller 110 may load one or more test patterns into electronic circuit. In another example, one or more components of electronic circuit 100 may include internal test patterns or built in testing controllers for generating test patterns, where calibration controller 110 may run tests on electronic circuit 100 by triggering one of the internal tests or built in test controllers within electronic circuit 100. In one example, a calibration controller 110 may perform calibrations to adjust one or both of signal delays and VREF each time the computer system or memory system starts, restarts or becomes active, such as waking up from a sleep mode. In addition, calibration controller 110 may select to periodically calibrate delays while powered on to monitor whether signals are failing to arrive during valid time windows. Those of ordinary skill in the art will appreciate that as electronic circuit 100 undergoes system starts, resets, or becomes active, maintaining the operation of DRAM 130 may require the use of memory initialization sequences for calibration by calibration controller 110 to perform write leveling, read leveling, and write and read calibration steps, and that such memory initialization sequences may be specified by individual entities or by a global standards body, such as JEDEC.

In one example, calibration controller 110 performs one or more types of tests to adjust the settings of programmable WR setting 126 to tune and center write data timing to meet write parameters 112, to adjust the settings of programmable RD setting 128 to tune and center read data timing to meet read parameters 114, and adjust the settings of programmable CAC setting 129 to tune and center control and address and return data timing to meet CAC parameters 116. In the example, programmable WR setting 126, programmable RD setting 128, and programmable CAC setting 129 are separate settings. In additional or alternate embodiments, one or more of the settings within programmable WR setting 126, programmable RD setting 128, and programmable CAC setting 129 may be combined into fewer separate settings or distributed into additional separate settings.

In one example, calibration controller 110 may include a serial control 160 to tune the settings of programmable WR setting 126, programmable RD setting 128, and programmable CAC setting 129. Through serial control 160, calibration controller 110, may perform read, write, and CAC calibrations or characterization shmoos by running each of the read, write, and CAC tests for calibrations and shmoos separately, independently and serially, first running read tests to calibrate programmable RD setting 128 only, second running write and read tests to calibrate programmable WR setting 126 only, and then third running CAC tests to calibrate programmable CAC settings 129 only. In particular, through serial control 160, read calibrations may be separately conducted by calibration controller 110 using read shmoos that read to multi-purpose registers (MPRs) of DRAM 130. In particular, through serial control 160, write calibrations may be separately conducted by calibration controller 110 using write and read patterns for characterization shmoos, which duplicate the read commands issued during the read calibration. In particular, through serial control 160, CAC calibrations may be separately conducted by calibration controller 110 using a series of calibrate, command and address signals on CA bus 139 along with writing data on data bus 140, and then reading the results of the tests run by CAC control 136 from data bus 140 from one or more data pins, such as one or more DQ pins.

In one example, a "shmoo" may refer to a name for a type of characterization or plot produced by calibration controller 110 based on testing of electronic circuit 100 or the type of testing performed to generate a "shmoo characterization". In one example calibration controller 110 may run multiple read tests, under different combinations of conditions within the range of conditions, and generate a "shmoo characterization" that provides a graphical representation of the ability of electronic circuit 100 to operate in response to various combinations of two variable operating conditions. For example, calibration controller 110 may repeatedly test electronic circuit 100 using different combinations of settings for voltage 150 and frequency 152 and characterize the results by plotting the results in a graph. For example, by plotting the results of the different combinations of settings for voltage 150 on an X-axis and frequency 152 only the y-axis, along with the testing results, in a graph, calibration controller 110 may determine which of the combinations of operating parameters for voltage and frequency yield results that "pass" or "fail" according to write parameters 112 or read parameters 114. In one example, a shmoo characterization may depict the operating limits of circuit 100 with respect to the various combinations of multiple operation conditions.

In one example, though a shmoo characterization is useful for detecting settings of conditions that "pass" within the parameters for a circuit, running a sufficient number of tests to produce the shmoo characterization requires calibration controller 110 to perform a significant number of tests. In addition, calibration through shmoos takes even more time if a multi-dimensional shmoo is performed, where a multi-dimensional shmoo may include adjusting additional operating conditions and adding an additional axis to the graph for each additional operating condition. In addition, calibration through shmoos takes even more time as the number of components within electronic circuit 100 increases.

In one example, if calibration controller 110 applies serial control 160 to separately and serially perform read, write, and CAC calibrations of programmable RD setting 128, programmable WR setting 126, and programmable CAC setting 129, as previously described, then the total calibration time required includes time for individually running each of the tests for each of the range of delays. For example, if under serial control 160 the read test is run for a range of 10 delays in programmable RD setting 128 only, then a write test is separately run for a range of 10 delays in programmable WR setting 126 only, and then a CAC test is separately run for a range of 10 delays in programmable CAC settings 129 only, calibration controller 110 would require calibration time for setting delays 30 times total.

However, to reduce the calibration time required for testing ranges of delays in programmable RD setting 128, programmable WR setting 126, and programmable CAC setting 129, in the present invention, calibration controller 110 may include simultaneous control 162 to simultaneously conduct write, read, and CAC calibrations or characterization shmoos to reduce the calibration time required for testing a range of delay settings. For example, under simultaneous control 162, using simultaneous write, read, and CAC calibrations, for testing a range of 10 delays in each of programmable RD setting 128, programmable WR setting 126, and programmable CAC setting 129, calibration controller 110 simultaneously sets each of programmable RD setting 128, programmable WR setting 126, and programmable CAC setting 129 for a write, read, and CAC test, only requiring calibration time for setting delays 10 total times, which significantly reduces the calibration time required. While in the example calibration controller 110 is illustrated with both serial control 160 and simultaneous control 162, in additional or alternate embodiments, calibration controller 110 may include simultaneous control 162 only and not include serial control 160.

In the example, under simultaneous control 162, to fully test for the write edges, read edges, and CAC edges indicated by failures across a range of delay and VREF settings, calibration controller 110 may conduct one or both of fine timing delay and voltage reference (VREF) centering through simultaneous write, read, and CAC calibration or characterization shmoos. In particular, simultaneously conducting write, read, and CAC calibrations or characterization shmoos includes simultaneously adjusting programmable RD setting 128 to meet read parameters 114, adjusting programmable WR setting 126 to meet write parameters 112, and adjusting programmable CAC setting 129, for a range of delay settings, which avoids duplication of efforts with regard to read calibration and shmoos that occurs if read calibration of programmable RD setting 128 and write calibration of programmable WR setting 126 are performed separately for a range of delay settings and avoids duplication of efforts with regard to write calibration and shmoos that occurs if write calibration of programmable WR setting 126 and write calibration of programmable CAC setting 129 are performed separately for a range of delay settings.

Therefore, in the example, calibration controller 110 is optimized using simultaneous control 162 to perform reads during both a read calibration of programmable RD setting 128 and a write calibration of programmable WR setting 126, to combine the calibration of programmable RD setting 128 and programmable WR setting 126 and reduce the number of reads required for calibration of both settings. In addition, in the example, calibration controller 110 is optimized using simultaneous control 162 to perform writes during both a write calibration of programmable WR setting 126 and a write calibration of programmable CAC setting 129, to combine the calibration of programmable WR setting 126 and programmable CAC setting 129 and reduce the number of writes required for calibration of both settings. Further, by combining write, read, and CAC calibrations together, calibration controller 110 is optimized through simultaneous control 162 to significantly reduce the number of write and read commands required for calibration, reducing the overall calibration time and reducing the overall power consumed during calibration. Using simultaneous control 162 to simultaneously set all of the programmable settings, compared to using serial control 160 to serially set each of the programmable settings, improves the performance and operation of electronic circuit 100.

In one example, calibration controller 110 may periodically perform simultaneous write, read, and CAC calibrations or characterization shmoos using simultaneous control 162 while electronic circuit 100 is running in a system. In particular, once programmable WR setting 126, programmable RD setting 128, and programmable CAC setting 129 are initially set upon initialization of a system or a new component, while electronic circuit 100 is operating, the settings may degrade over time due to conditions such as temperature and aging, requiring that the settings be periodically reassessed and updated. Calibration testing and delay programming requires memory system bandwidth, therefore there is a need for efficient calibration testing by calibration controller 110, such as by performing simultaneous write, read, and CAC calibrations using simultaneous control 162, to minimize the required memory system bandwidth required to adjust for incorrect timing delay settings and VREF settings in programmable WR setting 126, programmable RD setting 128, and programmable CAC setting 129.

Calibration controller 110 may use simultaneous control 162 to perform simultaneous write and read calibrations or characterization shmoos using one or more types of write and read tests including, but not limited to a 20× WR and 20× RD or a WR/RD 20×. In addition, in one example, calibration controller 110 may use simultaneous control 162 to perform simultaneous write, read, and CAC calibrations or characterization shmoos with multiple types of search algorithms. For example, calibration controller 110 may simultaneously perform write calibrations or shmoos with binary shmoos and perform read calibrations or shmoos linearly.

In one example, to simultaneously conduct read, write, and CAC calibrations or characterization shmoos, calibration controller 110 may use simultaneous control 162 to monitor for failures and determine the cause of the failures, whether from CAC, write or read. In one example, calibration controller 110 may assume that failures are not due to bad DRAMs or to bus turnaround time, but are due to the setting of one or more of the conditions to a value in the range that is outside optimal performance parameters.

In one example, in FIG. 1, in addition to calibration controller 110 detecting timing parameter failures, determining whether the write, read or both failed, and determining the horizontal write edge, read edge, or both, calibration controller 110 may detect VREF failures and similarly determine whether the write, read or both failed, and determine the vertical write edge, read edge or both. In one example, write and read data may pass timing parameter requirements, but fail VREF requirements. In another example, one or both of write and read data may fail timing parameter requirements and fail VREF requirements. In addition, while timing parameter failures may be described with regard to horizontal write edge and horizontal read edge and VREF failures may be described with regard to vertical write edge and vertical read edge, in additional or alternate embodiments, timing parameter failures may be described with regard to another dimension, such as vertical write edge and vertical read edge, and VREF failures may be described with regard to another dimension, such as horizontal write edge and horizontal read edge.

Figure 2:
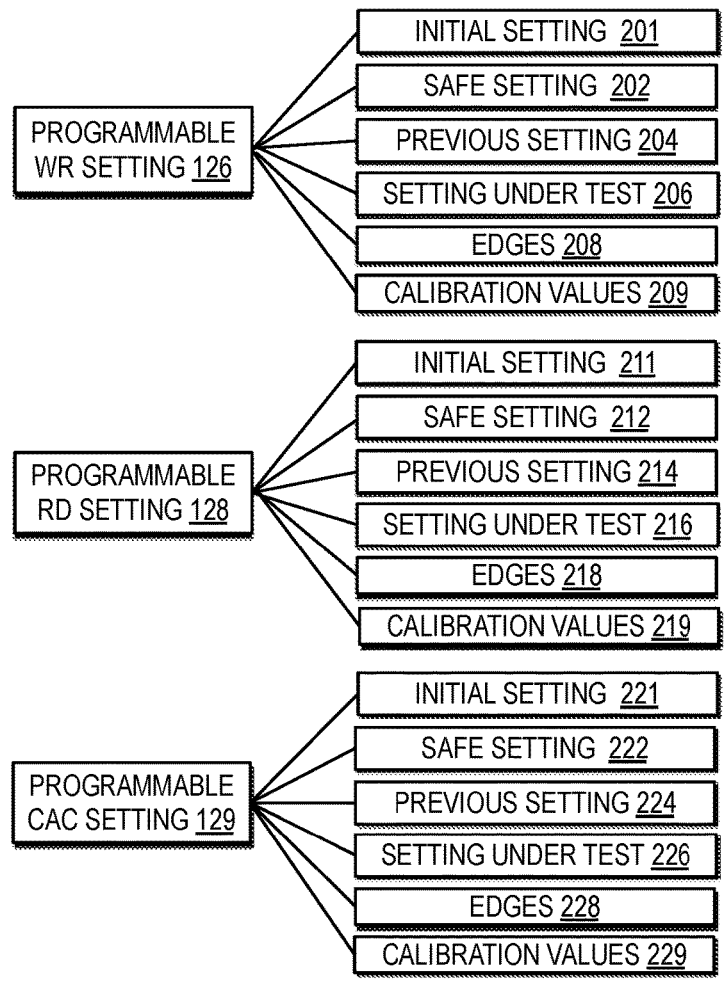
FIG. 2 is a block diagram of one example of multiples types of data that may be stored, updated, and calibrated in the programmable WR setting, programmable RD setting, and programmable CAC setting during simultaneous calibration of each of the settings.

FIG. 2 illustrates a block diagram of one example of multiples types of data that may be stored, updated, and calibrated in the programmable WR setting, programmable RD setting, and programmable CAC setting during simultaneous calibration of each of the settings.

In one example, FIG. 2 illustrates multiple types of data that may be stored, updated, and calibrated in programmable WR setting 126, programmable RD setting 128, and programmable CAC setting 129. In one example, one or more types of data may be stored, updated, and calibrated in each of the settings during one or more phases of operation of simultaneous control 162. In addition, serial control 160 may store, update, and calibrate one or more types of data in each of the settings during one or more phases of operation.

In one example, each of programmable WR setting 126, programmable RD setting 128 and programmable CAC setting 129 may each include an initial setting, illustrated as initial setting 201, initial setting 211, and initial setting 221, respectively. In one example, each initial setting may include a value predicted to enact successful read, write, and CAC operations to memory. In particular, in one example, the initial settings may include an initial set of delays and adjustments in programmable WR setting 126, programmable RD setting 128, and programmable CAC setting 129 that are predicted to yield successful read, write, and CAC operations to memory during a base test. In one example, these initial settings may also include settings which, when applied during the base test, may align clock phase rotators, programmable delay lines, and one or more additional elements of the electronic circuit to vary the launch timings of outgoing command, address, and control signals, outgoing data, incoming strobes, and incoming data, with respect to the memory clocks and each other. In addition, in one example, the initial settings may include settings for the CA bus and for the incoming strobe and read delay path that would allow data patterns to be captured into the memory device for subsequent read back by issuing read commands using initial read path settings. In one example, the initial settings may be generated and selected from one or more sources including, but not limited to, from data collected through characterization during hardware development and from design parameters employed in software modeling of the intrinsic circuitry of the electronic device operating in an intended environment. One of ordinary skill in the art will appreciate that the initial settings may be loaded or established through one or more input sources including, but not limited to, a firmware accessible input source, propagation via external test equipment through the chip input/output interface, use of a functional scan path for initializing registers and latches, and use of a persistent storage device such as flash-based memory, an EPROM, or blown fuses to allow read out and transfer of the settings into the memory interface calibration logic.

In addition, in one example, each of programmable WR setting 126, programmable RD setting 128 and programmable CAC setting 129 may include a safe setting, illustrated as safe setting 202, safe setting 212, and safe setting 222, respectively. In one example, each safe setting may include a value detected as passing during a test under simultaneous control 162. While in the example the initial setting and the safe setting are shown as separate settings, in other examples, the safe setting represents a pointer to another setting value.

In addition, in one example, each of programmable WR setting 126, programmable RD setting 128 and programmable CAC setting 129 may include a previous setting, illustrated as previous setting 204, previous setting 214, and previous setting 224, respectively. In one example, each previous setting may include the value previously set in another data value within each programmable setting. For example, prior to changing one of the other values in each programmable setting, the current value may be stored as the previous setting.

In addition, in one example, each of programmable WR setting 126, programmable RD setting 128 and programmable CAC setting 129 may include a setting under test, illustrated as setting under test 206, setting under test 216, and setting under test 226, respectively. In one example, each setting under test may include the value current loaded for testing by simultaneous control 162.

In addition, in one example, each of programmable WR setting 126, programmable RD setting 128 and programmable CAC setting 129 may include edges, illustrated as edges 208, edges 218, and edges 228, respectively. In one example, each of the edges may include one or more horizontal and vertical edges identified during testing by simultaneous control 162 to set the delays and VREFs for each programmable setting.

In addition, in one example, each of programmable WR setting 126, programmable RD setting 128 and programmable CAC setting 129 may include calibration values, illustrated as calibration values 209, calibration values 219, and calibration values 229, respectively. In one example, each of the calibration values may include one or more delays and VREFs set based on the edges found during calibration in edges 208, edges 218, and edges 228, respectively.

Figure 3:
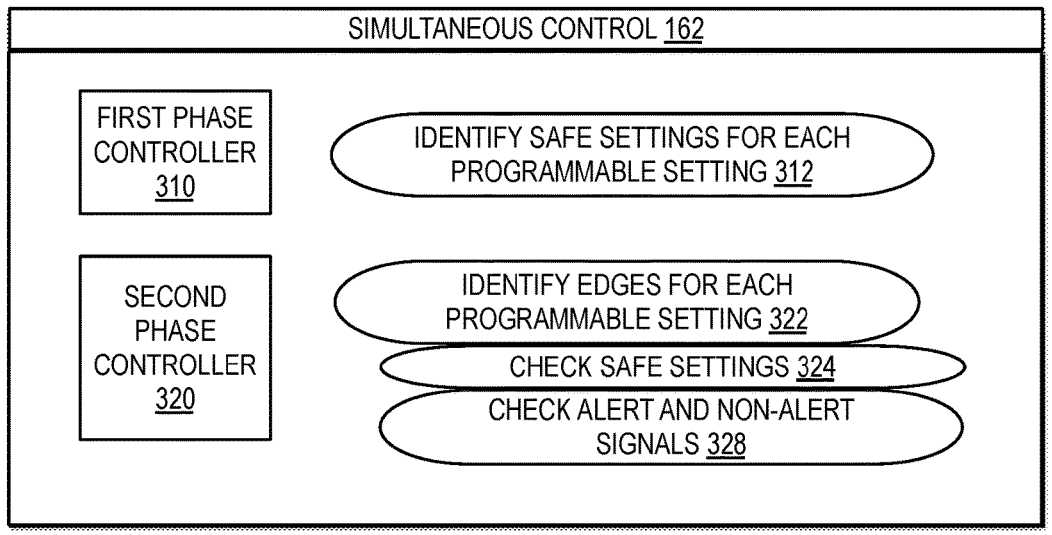
FIG. 3 is a block diagram of one example of functional phase components for controlling simultaneous calibration of read, write, and CAC settings of an electronic circuit.

FIG. 3 illustrates a block diagram of one example of functional phase components for controlling simultaneous calibration of read, write, and CAC settings of an electronic circuit.

In one example, functional elements of simultaneous control 162 may include, but are not limited to, a first phase controller 310 and a second phase controller 320. In one example, first phase controller 310 and second phase controller 320 may represent separate controllers or may share one or more functional control elements. In an additional or alternate embodiment, simultaneous control 162 may also only include second phase controller 320.

In one example, first phase controller 310 may control a first stage of simultaneously conducting read, write, and CAC calibrations and characterization shmoos, by running an initial calibration check to either identify safe settings for each programmable setting as illustrated at reference numeral 312 or shift to a recovery action. In the initial calibration check, first phase controller 310 may first set or direct the setting under test of each of programmable WR setting 126, programmable RD setting 128 and programmable CAC setting 129 to a value set as the initial setting for each programmable setting. For example, first phase controller 310 may set setting under test 206 to initial setting 201, setting under test 216 to initial setting 211, and setting under test 226 to initial setting 221.

Next, first phase controller 310 may first run an initial CAC check, second run an initial read check, and third run an initial write check. In one example, in running an initial CAC check, first phase controller 310 tests the CAC command timing for the current settings in programmable CAC setting 129 against CAC parameters 116 to determine a passing CAC delay and safe setting 222 based on the passing CAC delay or to determine whether there is a failure in electronic circuit 100 that cannot be calibrated to, and the testing ends. In one example, in running an initial read check, first phase controller 310 tests the read data timing for the current settings in programmable RD setting 128 against read parameters 114 to determine a passing read delay and set safe setting 212 based on the passing read delay or to determine whether there is a failure in electronic circuit 100 that cannot be calibrated to, and the testing ends. In one example, first phase controller 310 may set setting under test 216 that passes the read test as safe setting 212. In running an initial write check, first phase controller 310 tests write data timing for the current settings in programmable WR setting 126 against write parameters 112 to determine a passing write delay and set safe setting 202 based on the passing write delay or to determine whether there is a failure in electronic circuit 100 that cannot be calibrated to and the testing ends. In one example, first phase controller 310 may set setting under test 206 that passes the write test as safe setting 202.

In one example, if first phase controller 310 positively identifies safe settings for each programmable setting as illustrated at reference numeral 312, second phase controller 320 is triggered. In additional or alternate embodiments, additional or alternate conditions may trigger second phase controller 320.

Second phase controller 320, in a second stage of the combined calibration and shmoo characterization check, starts by simultaneously updating the setting under test in each of programmable WR setting 126, programmable RD setting 128, and programmable CAC setting 129 for running a combined check. Next, second phase controller 320 conducts a combined write, read, and CAC test and compares the combined results with write parameters 112, read parameters 114, and CAC parameters 116. If the combined write, read, and CAC test results do not fail in write parameters 112, read parameters 114, and CAC parameters 116, then calibration controller 110 may store each tested setting as a previous setting and set the setting under test in programmable WR setting 126, programmable RD setting 128, and programmable CAC setting 129, to a next selection of test values, adjusting the time delay and VREF settings. Second phase controller 320 may run the combined write, read, and CAC test on the next selection of test values for the adjusted write delay, the adjusted read delay, and the adjusted CAC delay.

In one example, second phase controller 320 continues to update the setting under test in programmable WR setting 126, programmable RD setting 128, and programmable CAC setting 129 to a next selection and run combined write, read, and CAC tests until second phase controller 320 identifies edges 208, edges 218, and edges 228 for each programmable setting as illustrated at reference numeral 322. In one example, second phase controller 320 may identify edges when the test results fail one of write parameters 112, read parameters 114, and CAC parameters 116. In particular, if the combination of RD, WR, and CAC settings tested have caused the test to fail, then the particular setting that caused the test to fail needs to be determined to identify an edge. For each run of the test on the combined settings that does not fail, the impact of testing is minimized to a single testing cycle to test all three settings. It is only when a test of the combined settings fails that additional analysis is performed to determine which setting caused the failure. In particular, in general, to determine which of the settings caused a failure, the setting under test of one or more programmable settings are reset to a prior passing delay from among an initial setting, a safe setting, or the previous setting, and a test is effectively conducted with prior passing delays. If the test passes on a rerun with a prior passing delay, then it is determined that the particular setting under test set to the prior passing delay, caused the failure.

In one example, upon second phase controller 320 detecting a failure for the combined test, second simultaneous control 162 may perform additional steps to determine the cause of the failure according to an order for checking which programmable setting caused the failure. In one example, second phase controller 320 may implement one or more selections of steps to determine the cause of failure, illustrated in the example by check safe settings 324 and by check alert and non-alert signals 328. In one example, FIG. 7, described in further detail below, illustrates one example of a process for performing the steps of check safe settings 324. In one example, FIGS. 8, 9, and 10, described in further detail below, illustrate examples of a process for performing the steps of checking alert and non-alert signals 328. While FIGS. 7, 8, 9, and 10 illustrate one order of checking which programmable settings trigger a failure, in additional or alternate embodiments, the order of checking which programmable setting triggered a failure may be adjusted. In one example, a prior passing condition or delay may include an initial setting or a safe setting.

In one example, for second phase controller 320 to implement check safe settings 324, second phase controller 320 may first check for a CAC failure by setting the programmable CAC settings to the safe settings and rerunning the test. For example, second phase controller 320 may set the setting under test for the programmable CAC setting to a prior passing delay, store the previous failing setting as a previous setting, and rerun the combined test. If the re-run of the combined test does not fail, then the CAC edge is identified from the previous setting that failed. If the re-run of the combined test fails again with the CAC safe settings, then second phase controller 320 performs additional testing to evaluate for each of a WR, RD, and CAC edge.

In one example, under check safe settings 324, if the re-run of the combined test with the programmable CAC setting set to a prior passing delay does fail, then second phase controller 320 may perform tests to distinguish between a read or write fail. For example, second phase controller 320 may first return the setting under test of programmable RD setting 128 to a safe setting. In the example, second phase controller 320 may re-read the read portion of the WR/RD test using the safe setting and the compare the combined results with write parameters 112 and read parameters 114. If the combined results of the read portion of the WR/RD test fail, then a write edge is identified, where the write edge indicates that the write data results fell outside the window allowed for write data. In addition, if a write edge is found, then the data is re-written with a known safe setting in programmable WR setting 126 and the read portion re-read, to ensure that the read settings did not fail at the same time as the write settings. However, if the combined results of the read portion of the WR/RD test do not fail, then a read edge is identified, where the read edge indicates that the read data results fell outside the window allowed for read data.

In addition, if the test includes multiple WR commands and multiple RD commands, then check safe settings 324 may include one or more additional steps to determine the identifier of the failing command, detect the particular WR delay setting and the particular RD delay setting occurring during the failing command, and store the particular WR delay setting and particular RD setting during the failing command. In one example, the particular WR delay setting and particular RD setting occurring during the failing command identifier may be detected from one or more types of data storage devices, including, but not limited to, one or more of a series of counters, working registers, and muxes, that may be used to track the outstanding read and write commands and the associated delay values with each of the commands.

In one example, once write and read edges are tested for under check safe settings 324, second phase controller 320 may set the setting under test for programmable CAC setting 129 to the previous setting that failed and set the setting under test for programmable WR setting 126 and programmable RD setting 128 to a prior passing delay and rerun the test. If the test fails, then a CAC edge is identified from the tested previous setting that failed.

In one example under check safe settings 324, once one or more of a read edge, write edge, or CAC edges is identified, calibration controller 110 may adjust the setting under test in programmable WR setting 126, programmable RD setting 128, programmable CAC setting 129 again and conduct the combined write, read, and CAC test again. Second phase controller 320 may continue to iteratively adjust the setting under test and conduct the combined write, read, and CAC test again until the testing is detected as done. In one example, once second phase controller 320 identifies one or more horizontal and vertical RD, WR, and CAC edges for each programmable setting, the combined testing is done. In another example, second phase controller 320 may detect the combined testing as done based on whether or not a maximum threshold is exceeded before finding delay and VREF edges for each of the programmable settings. In yet another example, second phase controller 320 may detect the combined testing as done based on whether or not the process has run longer than a threshold amount of time. In another example, second phase controller 320 may detect the combined testing as done based on whether or not a minimum specified VREF and delay margin have been found as passing. In additional or alternate embodiments, additional or alternate conditions may be set for determining whether or not all the testing necessary to effectively calibrate the electronic circuit is complete.

In the example, in response to second phase controller 320 detecting the testing is done, second phase controller 320 may set the calibration values for each programmable setting to the edges detected during testing and calibration controller 110 may exit the calibration. For example, second phase controller 320 may set calibration values 209 from edges 208, set calibration values 219 from edges 218, and set calibration values 229 from edges 228.

In another example, second phase controller 320 may identify edges for each of the programmable settings by checking alert and non-alert signals under check alert and non-alert signals 328. In one example, FIGS. 8, 9, and 10, described in detail below, show one example of a process for implementing check alert and non-alert signals 328 of second phase controller 320 to identify edges for each of programmable settings.

In one example, the alert signal that is checked by second phase controller 320 may include one or more types of alert signals including, but not limited to, an alert signal indicating a write cyclic redundancy cycle (CRC) error flag and an alert signal indicating a command and address (CA) parity error flag, where the alert signal may be output on CA bus 139 or data bus 140, depending on architecture. In one example, DRAM 130 may include one or more built-in error detection modes including, but not limited to, CRC for data bus 140 and parity checking for the command and address bits on CA bus 139. In one example, one or more of write control 132 and read control 134 may perform error detection for CRC and CAC control 136 may perform error detection for CA parity. In one example, an alert signal may refer to an alert_n signal, which is a JEDEC specification signal. In additional or alternate examples, the alert signal may be implemented in other manners based on the interface's implementation.

In one example, to monitor for CRC errors, DRAM 130 may generate a checksum per-write burst and compare the checksum against an expected data pattern checksum. If the two checksums do not match, DRAM 130 may flag an error.

In one example, the CRC error in DRAM 130 may set a flag using the alert_n signal. For example, in a DDR4 DRAM, for the CRC error flagging, alert_n will go low for an interval and then go back high.

In one example, to monitor for CA parity errors, DRAM 130 may monitor the signals on CA bus 139 and use even parity to determine whether the number of 1s in a transmitted signal matches the parity setting sent by memory controller 120. DRAM 130 may represent a DDR4 DRAM, where in the case of a CA parity error, the alert_n signal on CA bus 139 goes low for a log period until the DRAM internal recovery transaction has completed.

In one example, to apply check alert and non-alert signals 328, second phase controller 320 may, in response to detecting a combined WR, RD, and CAC test has failed to determine if an alert_n signal is raised. If an alert_n signal is raised, then the alert signals are analyzed to identify an edge, determining whether the CRC or CA parity error caused the alert_n signal to raise, selecting one of the signals for one of the programmable settings to analyze, setting the programmable settings to safe settings, and conducting the testing again to determine whether the selected signal is a signal edge. If no alert_n signal is raised, then any non-alert signals are analyzed to identify an edge.

While using check safe settings 324 does not require using CRC or CA parity error signals, using check alert and non-alert signals 328 uses the CRC and CA parity error signals, which are already generated by DRAM 130, to efficiently aid in detecting edges. By using alert signals and non-alert signals that are already generated by DRAM 130, in addition to selecting one programmable setting at a time and setting other programmable settings to safe settings, using check safe settings 324 directs second phase controller 320 to efficiently identify write edges, read edges, and CAC edges based on error signals.

Figures 4, 5:
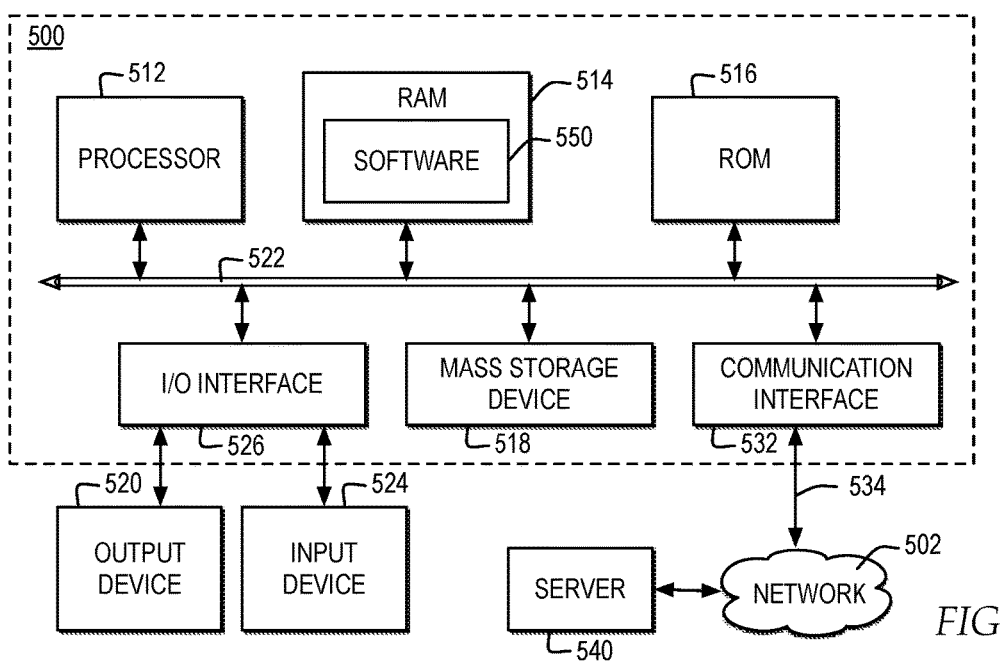
FIG. 4 illustrates an illustrative table of one example of the combination of test signal results that may be tested for and evaluated during a second phase of simultaneous testing for WR, RD, and CAC calibrations.
FIG. 5 is a block diagram illustrating one example of a computer system in which one embodiment of the invention may be implemented.

FIG. 4 illustrates an illustrative table of one example of the combination of test signal results that may be tested for and evaluated during a second phase of simultaneous testing for WR, RD, and CAC calibrations. In one example, a table 400 illustrates one example of 8 combinations of results that may occur from simultaneously testing for WR, RD, and CAC calibrations. In one example, table 400 includes columns for an ID 410, a total test result 412, a WR 414, a CAC 416, and a RD 418. In one example, total test result 412 indicates whether the results of simultaneous test for WR, RD, and CAC calibrations result in a test that passes, labeled as "P", or in a test that fails, labeled as "F". In one example, WR 414 indicates whether the WR setting under test caused the failure, CAC 416 indicates whether the CAC setting under test caused the failure, and RD 418 indicates whether the RD setting under test caused the failure. In one example, a first row of the table identified in ID 410 by "0" illustrates the only passing example, where each of the WR, RD, and CAC settings under test were passing. In one example, the remaining rows of the table identified in ID 410 by "1-7" illustrate each of the combinations of WR, RD, and CAC settings under test that may result in a total test result that fails. While in the example, ID 410 is illustrated for purposes of identifying each combination of WR, RD and CAC settings, in additional or alternate embodiments, each combination of WR, RD, and CAC settings may be identified by a different numeral identifier, a different type of identifier, or no identifier.

In one example, second phase controller 320, in one embodiment of the present invention, minimizes the time required for simultaneous calibration of programmable WR, RD, and CAC settings because for each test that results in a total test result of "P", as in the first row of the table identified by "0", second phase controller 320 only runs one test to calibrate WR, RD, and CAC programmable settings. In addition, second phase controller 320, in one embodiment of the present invention, minimizes the time required for simultaneous calibration of programmable WR, RD, and CAC settings because if a test fails, and the total test result is a fail, second phase controller 320 may select to focus on first checking for failures caused by the programmable CAC setting, such as the rows in ID 410 of "2", "3", "6", and "7". In one example, by first checking for failures caused by the programmable CAC setting, second phase controller 320 may select not to perform additional testing cycles to look for failures caused by the programmable WR and RD unless the programmable CAC setting is not shown to have caused the failure.

FIG. 5 illustrates a block diagram of one example of a computer system in which one embodiment of the invention may be implemented. The present invention may be performed in a variety of systems and combinations of systems, made up of functional components, such as the functional components described with reference to a computer system 500 and may be communicatively connected to a network, such as network 502.

Computer system 500 includes a bus 522 or other communication device for communicating information within computer system 500, and at least one hardware processing device, such as processor 512, coupled to bus 522 for processing information. Bus 522 preferably includes low-latency and higher latency paths that are connected by bridges and adapters and controlled within computer system 500 by multiple bus controllers. When implemented as a server or node, computer system 500 may include multiple processors designed to improve network servicing power.

Processor 512 may be at least one general-purpose processor that, during normal operation, processes data under the control of software 550, which may include at least one of application software, an operating system, middleware, and other code and computer executable programs accessible from a dynamic storage device such as random access memory (RAM) 514, a static storage device such as Read Only Memory (ROM) 516, a data storage device, such as mass storage device 518, or other data storage medium. Software 550 may include, but is not limited to, code, applications, protocols, interfaces, and processes for controlling one or more systems within a network including, but not limited to, an adapter, a switch, a server, a cluster system, and a grid environment.

Computer system 500 may communicate with a remote computer, such as server 540, or a remote client. In one example, server 540 may be connected to computer system 500 through any type of network, such as network 502, through a communication interface, such as network interface 532, or over a network link that may be connected, for example, to network 502.

In the example, multiple systems within a network environment may be communicatively connected via network 502, which is the medium used to provide communications links between various devices and computer systems communicatively connected. Network 502 may include permanent connections such as wire or fiber optics cables and temporary connections made through telephone connections and wireless transmission connections, for example, and may include routers, switches, gateways, and other hardware to enable a communication channel between the systems connected via network 502. Network 502 may represent one or more of packet-switching based networks, telephony based networks, broadcast television networks, local area and wire area networks, public networks, and restricted networks.

Network 502 and the systems communicatively connected to computer 500 via network 502 may implement one or more layers of one or more types of network protocol stacks which may include one or more of a physical layer, a link layer, a network layer, a transport layer, a presentation layer, and an application layer. For example, network 502 may implement one or more of the Transmission Control Protocol/Internet Protocol (TCP/IP) protocol stack or an Open Systems Interconnection (OSI) protocol stack. In addition, for example, network 502 may represent the worldwide collection of networks and gateways that use the TCP/IP suite of protocols to communicate with one another. Network 502 may implement a secure HTTP protocol layer or other security protocol for securing communications between systems.

In the example, network interface 532 includes an adapter 534 for connecting computer system 500 to network 502 through a link and for communicatively connecting computer system 500 to server 540 or other computing systems via network 502. Although not depicted, network interface 532 may include additional software, such as device drivers, additional hardware and other controllers that enable communication. When implemented as a server, computer system 500 may include multiple communication interfaces accessible via multiple peripheral component interconnect (PCI) bus bridges connected to an input/output controller, for example. In this manner, computer system 500 allows connections to multiple clients via multiple separate ports and each port may also support multiple connections to multiple clients.

In one embodiment, the operations performed by processor 512 may control the operations of flowchart of FIGS. 6-10 and other operations described herein. Operations performed by processor 512 may be requested by software 550 or other code or the steps of one embodiment of the invention might be performed by specific hardware components that contain hardwired logic for performing the steps, or by any combination of programmed computer components and custom hardware components. In one embodiment, one or more components of computer system 500, or other components, which may be integrated into one or more components of computer system 500, may contain hardwired logic for performing the operations of flowcharts in FIGS. 6-10.

In addition, computer system 500 may include multiple peripheral components that facilitate input and output. These peripheral components are connected to multiple controllers, adapters, and expansion slots, such as input/output (I/O) interface 526, coupled to one of the multiple levels of bus 522. For example, input device 524 may include, for example, a microphone, a video capture device, an image scanning system, a keyboard, a mouse, or other input peripheral device, communicatively enabled on bus 522 via I/O interface 526 controlling inputs. In addition, for example, output device 520 communicatively enabled on bus 522 via I/O interface 526 for controlling outputs may include, for example, one or more graphical display devices, audio speakers, and tactile detectable output interfaces, but may also include other output interfaces. In alternate embodiments of the present invention, additional or alternate input and output peripheral components may be added.

With respect to FIG. 5, the present invention may be a system, a method, and/or a computer program product. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punchcards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

Those of ordinary skill in the art will appreciate that the hardware depicted in FIG. 5 may vary. Furthermore, those of ordinary skill in the art will appreciate that the depicted example is not meant to imply architectural limitations with respect to the present invention.

Figure 6:
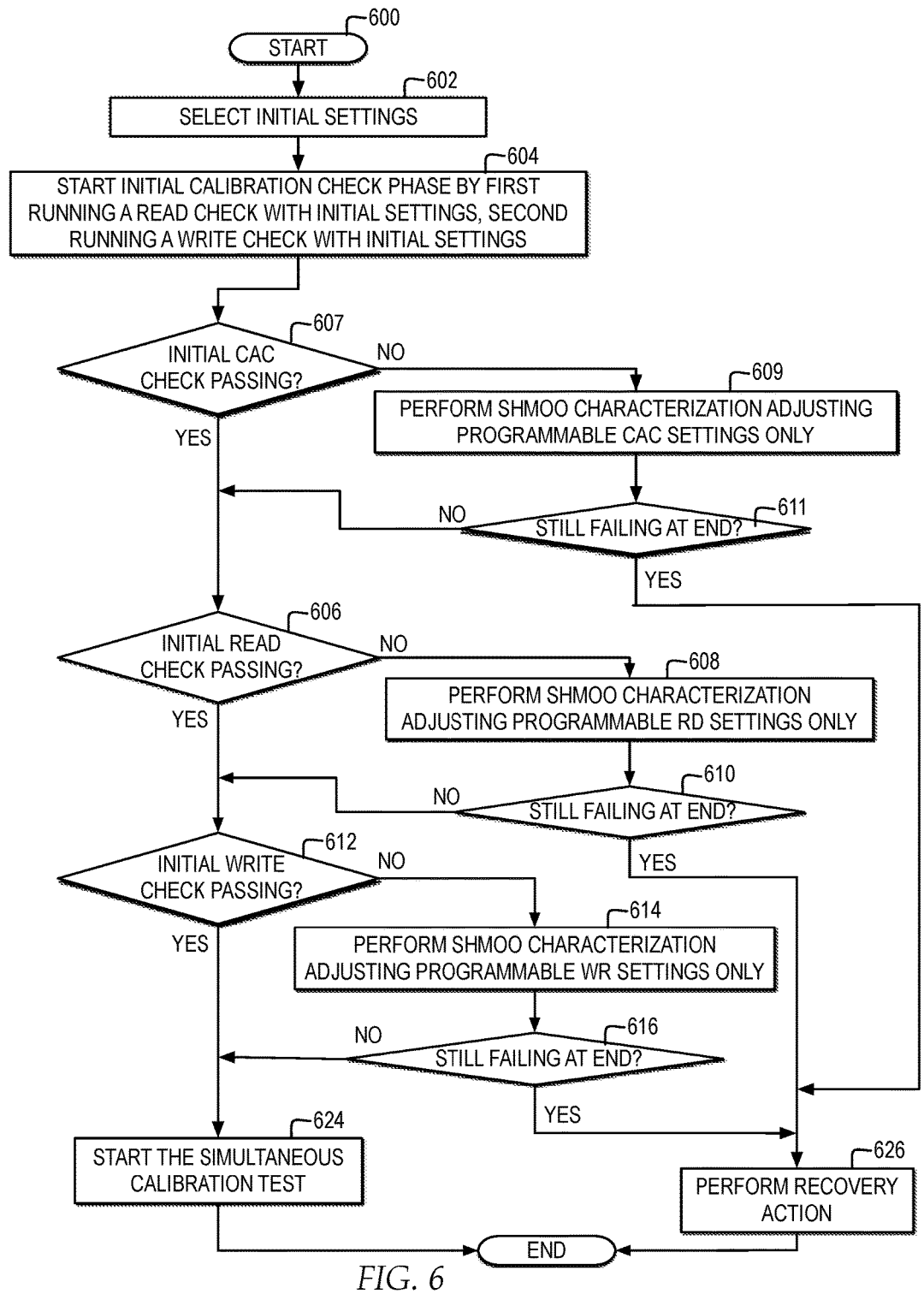
FIG. 6 illustrates a high-level logic flowchart of a process and computer program for performing each of an initial read check, an initial write check, and an initial CAC check, based on initial settings, in a first phase of a combined calibration check.

FIG. 6 illustrates a high level logic flowchart of a process and computer program for performing each of an initial read check, an initial write check, and an initial CAC check, based on initial settings, in a first phase of a combined calibration check.

As illustrated, in one example, a process and computer program begins at block 600 and thereafter proceed to block 602. Block 602 illustrates selecting initial settings, and the process passes to block 604. In one example, the initial settings may include, but are not limited to, initial delays, adjustments, and VREF settings for the programmable WR setting, the programmable RD setting, and the programmable CAC setting, along with settings on buses and other components of the electronic circuit.

Block 604 illustrates starting an initial calibration check phase by first running a read check with initial settings, allowing for a programmable RD settings delay and second running a write check with initial settings, allowing for a programmable WR settings delay. In one example, running each of the read check and write check, serially, may include running a separate base test for each of the checks.

In one example, running the base test for the read check may include running a sequence of read operations in a special read mode, such as multi-purpose register (MPR) mode, in order to provide known data patterns to transmit back on the interface undergoing calibration. In particular, by setting the initial settings for the CA bus along with those for the incoming strobe and read data path on the data bus, patterns may be properly captured and evaluated.

In one example, running the base test for the write check may include performing an initial write calibration test sequence where the memory device is placed in a normal functional mode and various data patterns are written to a pre-determined location in the memory device. In particular, setting the initial settings for the CA bus along with those for the outgoing data, patterns may be properly captured into the memory device for subsequent read back by issuing read commands using the initial read path settings.

Next, block 607 illustrates a determination whether an initial CAC check passes the CAC parameters, such as by comparing the test results with an expected data pattern in the CAC parameters. At block 607, if the initial read check is passing, then the process passes to block 606, which is described below. At block 609, if the initial read check is not passing, then the process passes to block 609. Block 609 illustrates performing shmoo characterization, adjusting the programmable CAC settings only. Next, block 611 illustrates a determination whether the CAC check is still failing at the end. At block 611, if the CAC check is still failing at the end, then the setting under test for the programmable CAC setting may be reset to the initial setting or a safe setting and the process passes to block 626. Block 626 illustrates performing a recovery action, and the process ends. In one example, a recovery action may include, but is not limited to, stopping all activity on a particular channel and triggering an alert that a diagnosis or repair procedure may be required to whether the hardware is defective and requires replacement. In addition, in one example, a recovery action may include returning to block 602 and restarting the first phase to determine whether the failing condition is persistent or intermittent and also to decide whether to proceed to block 624 if all the initial tests do pass the first phase. In additional or alternate embodiments, one or more types of recovery actions may be implemented at block 626.

Next, block 606 illustrates a determination whether an initial read check passes the read parameters, such as by comparing the test results with an expected data pattern in the read parameters. At block 606, if the initial read check is passing, then the process passes to block 612, which is described below. At block 606, if the initial read check is not passing, then the process passes to block 608. Block 608 illustrates performing shmoo characterization, adjusting the programmable RD settings only. Next, block 610 illustrates a determination whether the read check is still failing at the end. At block 610, if the read check is still failing at the end, then the setting under test for the programmable RD setting may be reset to the initial setting or a safe setting and the process passes to block 626.

Returning to block 610, if the read check is not still failing at the end, then the current setting under test for the programmable RD setting is set as the safe setting and the process passes to block 612. At block 612, if the initial write check is passing, then the process passes to block 624, which is described below. At block 612, if the initial write check is not passing, then the process passes to block 614. Block 614 illustrates performing shmoo characterization, adjusting the programmable WR settings only. Next, block 616 illustrates a determination whether the write check is still failing at the end. At block 616, if the write check is still failing at the end, then the setting under test for the programmable WR setting may be reset to the initial setting or the safe setting and the process passes to block 626. Returning to block 616, if the write check is not still failing at the end, then the process passes to block 624.

Block 624 illustrates starting the simultaneous calibration test, and the process ends. In one example, during the first phase, the settings under test detected as passing in the programmable RD settings, the programmable WR settings, and the programmable CAC settings may each be set as a safe setting that is known to pass serial read tests and write tests by yielding a valid comparison to expected data patterns. In one example, while FIG. 6 illustrates performing each of a CAC check, a read check, and a write check, in a first phase prior to starting the simultaneous calibration test at block 624, in additional or alternate embodiments, the first phase may also include only a selection of serial tests from among the CAC check, read check, and write check, in the same order or a different order, and may include additional or alternate types of initial testing prior to starting the simultaneous calibration test. In addition, in additional or alternate embodiments, the first phase of the combined calibration check may or may not be performed prior to selecting to start the simultaneous calibration test and a second phase of the combined calibration check.

Figure 7:
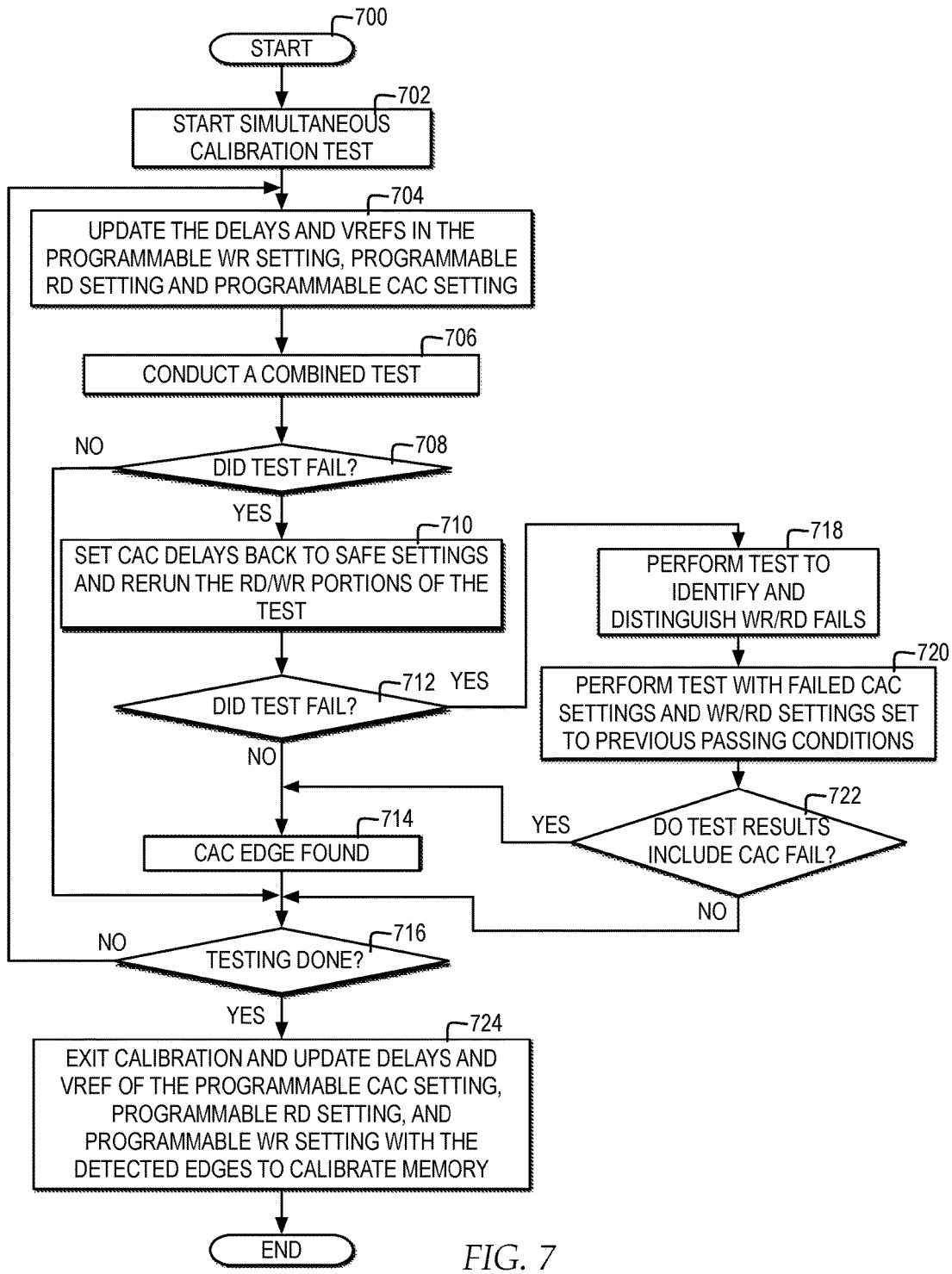
FIG. 7 illustrates a high-level logic flowchart of a process and computer program for performing a simultaneous, combined write, read, and CAC test in a second phase of a combined calibration check.

FIG. 7 illustrates a high level logic flowchart of a process and computer program for performing a simultaneous, combined write, read, and CAC test in a second phase of a combined calibration check.

In one example, a process and computer program start at block 700 and thereafter proceed to block 702. Block 702 illustrates starting the combined calibration test, which may be triggered by block 624 of FIG. 6 or may be independently triggered. Next, block 704 illustrates simultaneously updating the delay and VREF settings under test in the programmable RD setting, the programmable WR setting, and the programmable CAC setting. In the example, by setting the RD delay settings, WR delay settings, and CAC delay settings under test simultaneously, a combined write, read, and CAC test can be performed once, rather than a first time for the RD delay settings, a second time for the WR delay settings, and a third time for the CAC delay settings. In addition, by setting the RD delay settings, WR delay settings, and CAC delay settings under test simultaneously, different delays may be set to run during the streamed test for each of the WR delay settings, the RD delay settings, and the CAC delay settings, so that a single streaming test can simultaneously test WR delay settings, RD delay settings, and CAC delay settings, and test multiple different WR delay settings, multiple different RD delay settings, and multiple CAC delay settings.

In one example, the new delay values updated in block 704 may become the settings under test, and may be updated according to one or more rules each time block 704 is reached. In addition, each time the setting under test is updated, the previous setting under test may be stored as the previous setting. In one example, in selecting the settings in block 704 in one embodiment the selection may progress linearly from a minimum specified setting by incrementing the value according to a level of granularity supported by the underlying delay circuitry. For example, if a programmable delay chain includes 64 steps, with each step representing 15.625 picoseconds of delay, then the process may start at a zero delay setting and run the test 64 times, each time selecting to increment the delay in the settings at block 704 by 15.625 picoseconds until reaching the maximum 1000 picoseconds. In another example, the process for selecting delay settings at block 704 may start at a maximum delay and linearly decrement to the minimum delay setting. In another example, the process for selecting delay settings at block 704 may employ a binary search scheme to more rapidly test the various intermediate points of the delay chain. One of ordinary skill in the art will appreciate that one or more rules may be applied to select the next delay setting under test each time block 704 is reached.

Next, block 706 illustrates conducting a combined test for all the settings. Next, block 708 illustrates a determination whether the results of the combined test for all the settings fail for the write parameters, read parameters, or CAC parameters. In one example, a fail may include a read fail only, a write fail only, a CAC fail, or any combination of a read fail, a write fail, and a CAC fail. At block 708, if there is not a write, read, or CAC fail, then the process passes to block 716. Block 716 illustrates a determination whether the testing is done.

At block 716, if the testing is not done, then the process returns to block 704, where updated delay and VREF values for the programmable RD settings, programmable WR settings, and programmable CAC settings under test are selected. At block 716, if the testing is done then the process passes to block 724. Block 724 illustrates exiting the calibration and updating the calibration values of the delays and VREF of the programmable CAC settings, programmable RD setting, and programmable WR setting based on the identified vertical and horizontal edges to calibrate the memory interface, and the process ends.

Returning to block 708, at block 708, if there is one or more of a write, read, or CAC fail, then the process passes to block 710. Block 710 illustrates setting the CAC delays back to previously detected passing delay and rerunning the WR and RD portions of the test, to test whether the CAC setting caused the previous test to fail. In one example, the CAC setting is set to the passing delay first in determining which delay setting caused the failed test because the CAC address determines what data is written to or read from. Next, block 712 illustrates a determination whether the results of the test failed. In particular, to determine if the results of the test failed, a determination is made whether writing a known data pattern to memory and reading it back for comparison indicates a failure. At block 712, if the results of the test do not include an RD or WR fail, then a bad CAC value alone caused the failure and the process passes to block 714. Block 714 illustrates identifying a horizontal or vertical CAC edge for the current settings and results, including identifying the programmable RD setting, programmable WR setting, and programmable CAC setting for the CAC edge, and the process passes to block 716. In one example, an edge may be identified as a transition line from a passing setting to a failing setting. A horizontal edge may refer to VREF boundaries and a vertical edge may refer to delay boundaries. One of ordinary skill in the art will appreciate that one or more methods and techniques for analyzing and evaluating transmission optimization and eye margin may be applied at block 716 to identify the edge. One or more of the methods or techniques for analyzing and evaluating transmission optimization and eye margin may be specifically selected to reduce interface calibration time in an effort to achieve optimum transmission rates more quickly.

Returning to block 712, if the results of the test include an RD, WR, or CAC fail, then the process passes to block 718. Block 718 illustrates performing tests to identify and distinguish the WR and RD fails. In one example, to perform tests to identify and distinguish WR and RD fails, the WR delay may be set back to a safe setting value and a WR/RD test conducted, testing whether or not the current read settings would cause a failure. Subsequently, the RD delay may be set back to a safe setting value, while changing the WR value to the prior value and running an WR/RD test, testing whether or not the prior write value caused the fail. Next, block 720 illustrates performing tests with the failed CAC settings and with the WR and RD settings set to passing conditions. In the example, because block 720 is reached after an initial test fails and the test rerun fails with the CAC set to a safe setting that previously passed, there is one or both of a WR and a RD edge detected from the failed test in block 718, but there may also be a CAC edge detectable from the failed test as well. At block 722, if the results of the test do not include a CAC fail, then the process passes to block 716. At block 722, if the results of the test include a CAC fail, then the process passes to block 714. However, at block 722, the prior WR or RD fails have been noted in block 718.

Figure 8:
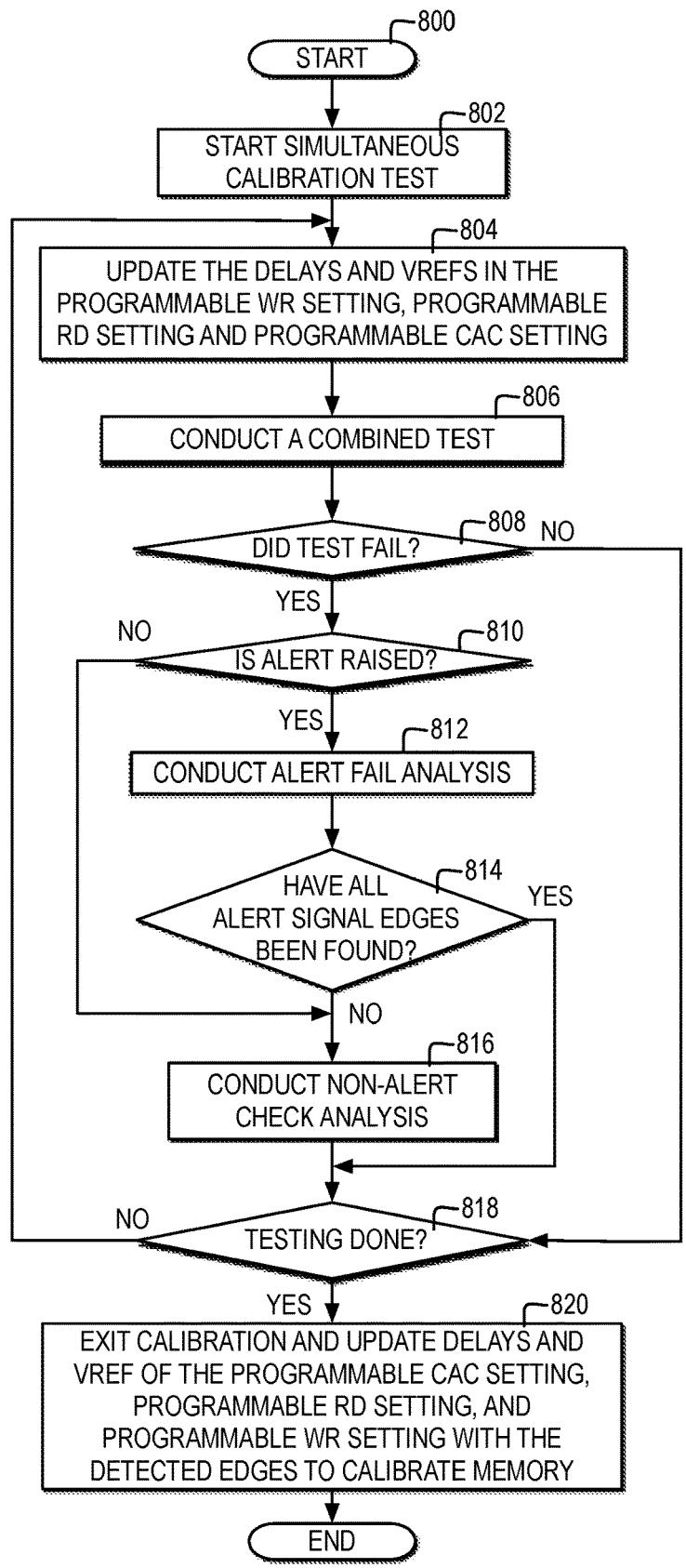
FIG. 8 illustrates a high-level logic flowchart of a process and computer program for determining which of a CAC, RD, or WR interface has failed during a second phase of a combined calibration check based on CA pair and CRC error flagging.

FIG. 8 illustrates a high-level logic flowchart of a process and computer program for determining which of a CAC, RD, or WR interface has failed during a second phase of a combined calibration check based on CA pair and CRC error flagging.

In one example, the process and program starts at block 800 and thereafter proceed to block 802. Block 802 illustrates starting the combined calibration test, which may be triggered by block 624 of FIG. 6 or may be independently triggered. Next, block 804 illustrates simultaneously updating the delay and VREF settings under test in the programmable RD setting, the programmable WR setting, and the programmable CAC setting. In one example, the new delay values updated in block 804 may become the settings under test, and may be updated according to one or more rules each time block 804 is reached. In addition, each time the setting under test is updated, the previous setting under test may be stored as the previous setting.

Next, block 806 illustrates conducting a combined test for all the settings. Next, block 808 illustrates a determination whether the results of the combined test for all the settings fail for the write parameters, read parameters, or CAC parameters. In one example, a fail may include a read fail only, a write fail only, a CAC fail, or any combination of a read fail, a write fail, and a CAC fail. At block 808, if there is not at least one of a write, read, or CAC fail, then the process passes to block 818. Block 818 illustrates a determination whether the testing is done.

At block 818, if the testing is not done, then the process returns to block 804, where updated delay and VREF values for the programmable RD settings, programmable WR settings, and programmable CAC settings under test are selected. In one example, at block 818, if the test failed at block 808 but no edges were identified at block 812 or block 816, then a determination may be made to rerun the same test with the same settings to see if the test fails again. If the same test with the same settings fails a second time, then a determination may be made that the error was due to noise. In additional or alternate embodiments, the process and computer program may include additional or alternate blocks for testing for and handling errors due to noise. At block 818, if the testing is done then the process passes to block 820. Block 820 illustrates exiting the calibration and updating the calibration values of the delays and VREF of the programmable CAC settings, programmable RD setting, and programmable WR setting based on the identified vertical and horizontal edges to calibrate the memory interface, and the process ends.

Returning to block 808, if there is at least one of a write, read, or CAC fail, then the process passes to block 810. Block 810 illustrates a determination whether an alert is raised.

At block 810, if an alert is raised, then the process passes to block 812. In one example, to determine whether an alert is raised, a determination is made whether the alert_n signal is set active from any of the error checkers in the DRAM. In one example, the alert may be raised by one or more the WR/RD CRC or CA parity, where the selection of CRC and CA parity that are monitored and may raise an alert is selectable based on the memory controller and memory device implementation. Block 812 illustrates conducting an alert fail analysis, which is further described with reference to FIG. 8. In general, in conducting an alert fail analysis, a determination is made which of the error checkers caused the fail and used alert_n as a notification of the fail. In conducting an alert fail analysis, the analysis determines whether more than one error checker went active at the time of the fail, so an exhaustive test is performed to identify the failing signals from the passing signals. Next, block 814 illustrates a determination whether all alert signal edges have been found. In one example, if no alert signal edges have been found at block 814, this indicates that all the tests performed in FIG. 8 passed the alert_n check. At block 814, if not all alert signal edges have been found, then additional analysis is required to determine the signal edges that have not yet been found and the process passes to block 816. In particular, in one example, a test may fail, but the alert fail analysis of the alert_n signal may not identify the CRC or CA parity interface that caused the failure. Errors may occur without manifesting as a CRC or CA parity error, such as in a data miscompare. Block 816 illustrates conducting a non-alert check analysis, which is further described with reference to FIG. 10, and the process passes to block 818.

Returning to block 814, at block 814, if all alert signal edges have been found, then no additional analysis is required on non-alert_n signals that have already found their edges and the non-alert check analysis is not triggered, then the process passes to block 818. In one example, one or more conditions may exist where a non-alert_n enabled interface has already determined a failing edge while other alert_n enabled interfaces are still in the process of finding their edges. For example, a case may exist where CA parity and WR CRC is enabled, but the RD does not have CRC enabled. In the example, as the calibration routine performs the steps in FIG. 8, the RD interface may identify failing edges faster through the non-alert check analysis than the WR and CAC interfaces, especially if the RD interface has less margin than the WR and CAC interfaces. After determining if the CA parity or WR CRC caused a failing test, at block 814 a determination may be made that all signal edges have already been found, and therefore the process may pass to block 818, skipping block 816.

Figure 9:
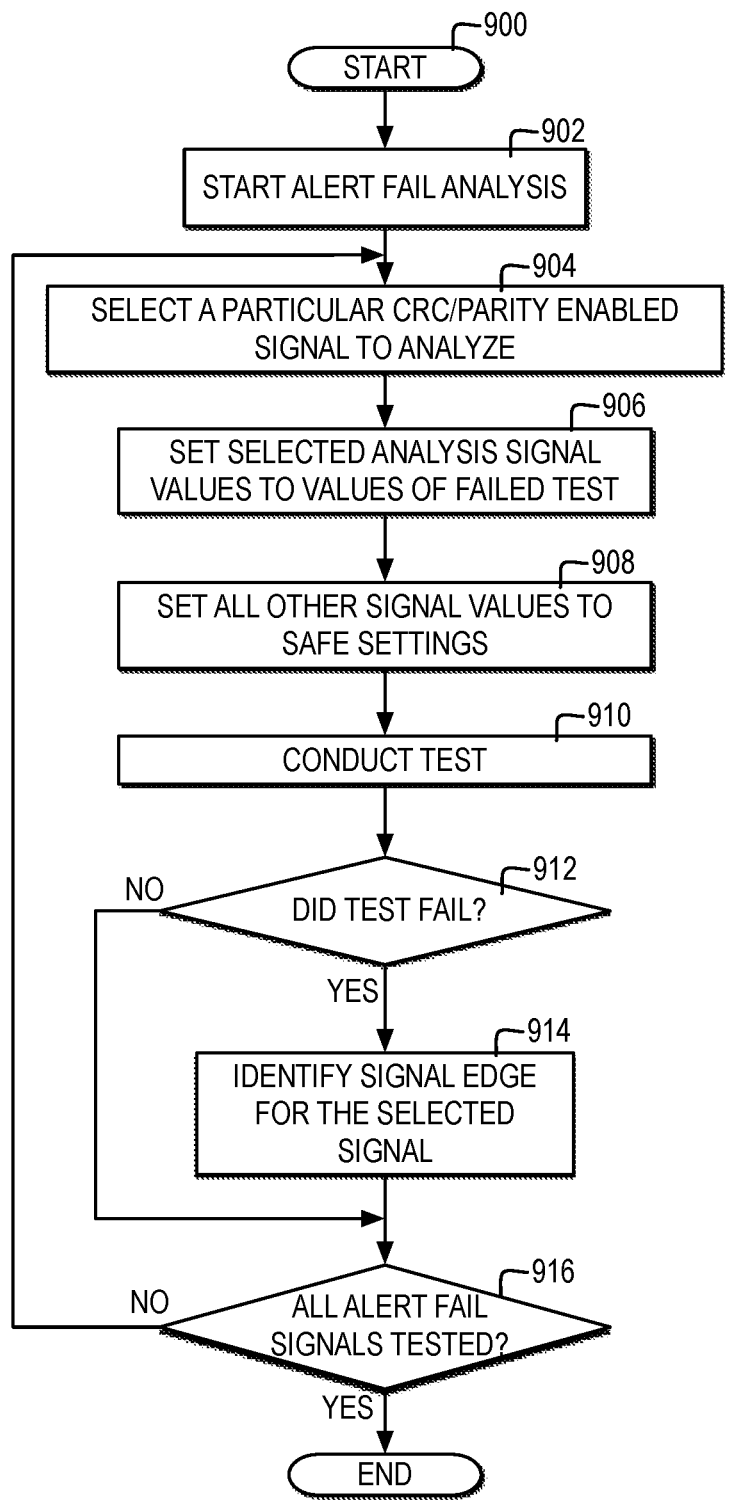
FIG. 9 illustrates a high-level logic flowchart of a process and computer program for performing an alert fail analysis during a second phase of a combined calibration check.

FIG. 9 illustrates a high-level logic flowchart of a process and computer program for performing an alert fail analysis during a second phase of a combined calibration check.

In one example, a process and computer program start at block 900 and thereafter proceed to block 902. Block 902 illustrates starting the alert fail analysis. In one example, block 902 is triggered by block 812 conducting an alert analysis in response to an alert_n signal being active. In one example, the WR CRC, RD CRC, and CA parity interfaces could all employ the alert_n signal. Next, block 904 illustrates selecting a particular CRC or CA parity enabled signal to analyze in the current loop. In one example, in selecting a particular CRC or CA parity enabled signal to analyze, all alert_n enabled interfaces may be identified and the process may loop through them regardless of whether each interface has finished calibration or not. In another example, in setting a particular CRC or CA parity enabled signal to analyze, the process may identify one or more of the WR CRC, RD CRC, and CA parity interfaces that are enabled with the alert_n signal, but have not finished calibration. In one example, the WR CRC, RD CRC, and CA parity interfaces may be looped through in a predefined order or in an order based on a selection or rules or conditions.

Next, block 906 illustrates setting the selected signal values under test to the values of a failed test at block 808. Next, block 908 illustrates setting all other signal values under test to the safe setting, from among safe setting 202, safe setting 212, and safe setting 222. Next, block 910 illustrates conducting a test that has a combination of writes and reads tested. Thereafter, block 912 illustrates a determination whether the test failed by looking at the alert_n signal state. In one example, if the alert_n signal is active, then the test failed. At block 912, if the test failed, then the process passes to block 914. Block 914 illustrates identifying a signal edge for the selected signal, where the current signal edge is the one or more interfaces set to test values of a failed test at block 906, and the process passes to block 916. Returning to block 912, if the test does not fail, then the process passes to block 916.

Block 916 illustrates a determination whether all alert fail signals are tested. In one example, multiple interfaces from among WR CRC, RD CRC, and CA parity interfaces may activate the alert_n signal. At block 916, if not all alert fail signals are tested, then the process returns to block 904 to identify a next interface to analyze and to perform the same tests. At block 916, if all alert fail signals are tested, then the process ends.

Figure 10:
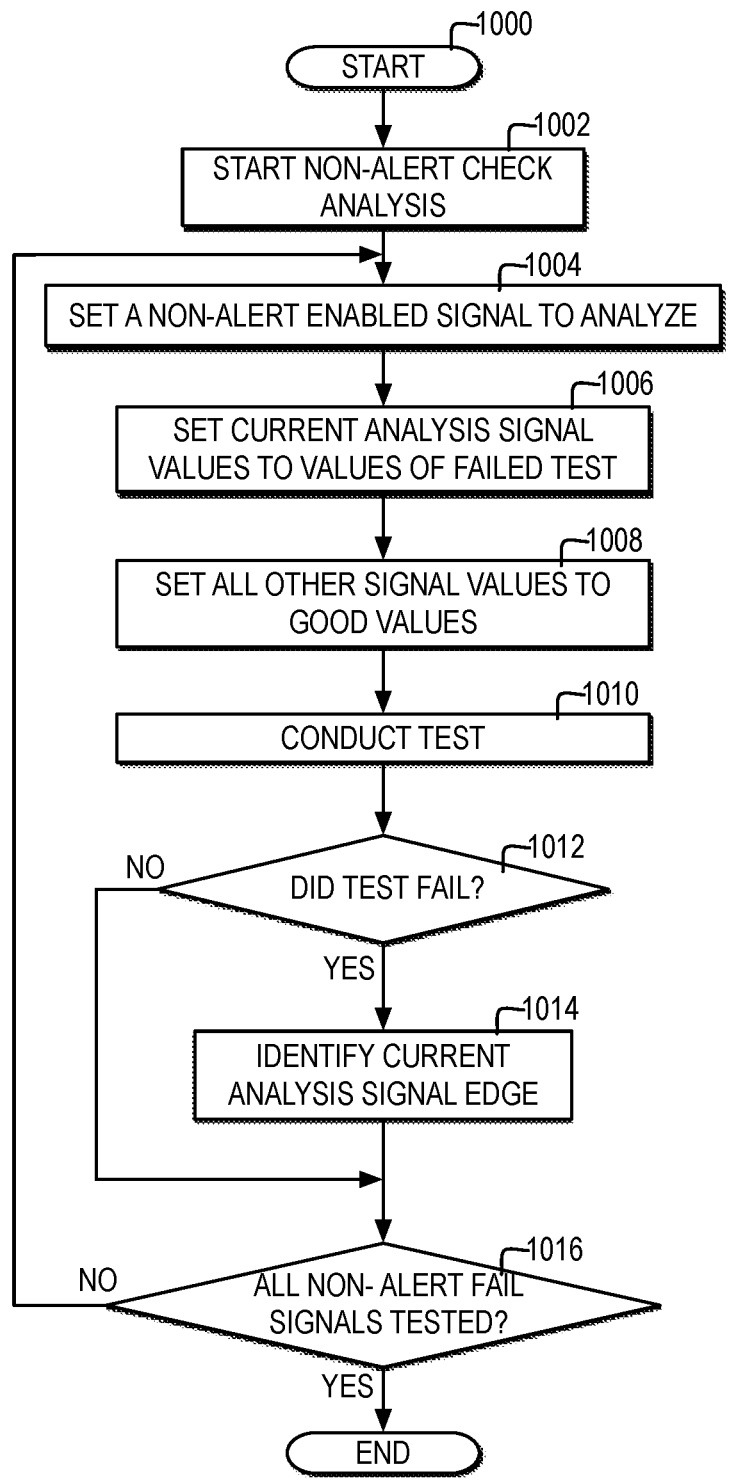
FIG. 10 illustrates a high-level logic flowchart of a process and computer program for performing a non-alert check analysis during a second phase of a combined calibration check.

FIG. 10 illustrates a high level logic flowchart of a process and computer program for performing a non-alert check analysis during a second phase of a combined calibration check.

In one example, a process and computer program start at block 1000 and thereafter proceed to block 1002. Block 1002 illustrates starting the non-alert check analysis. Next, block 1004 illustrates selecting the non-alert enabled signal to analyze from among the WR, RD, and CAC signal settings. In one example, to elect the non-alert enabled signal to analyze the process may identify all non-alert_n enabled interfaces and loop through them regardless of whether each identified interface has finished calibration or not. In another example, the process may identify and select a non-alert_n enabled interface by identifying interfaces that do not have alert_n enabled and that have not finished calibration. In additional or alternate embodiments, one or more types of processes may be implemented to identify and select which non-alert enabled signal to analyze and to select an order of analysis.

Thereafter, block 1006 illustrates setting the selected analysis signal values to the values of a failed test at block 708. Next, block 1008 illustrates setting all other signal values to safe settings. Next, block 1010 illustrates conducting a test. In one example, the test may include a known data pattern used to check the series of reads and writes performed with the current settings. Thereafter, block 1012 illustrates a determination whether the test failed. In one example, to determine if the test failed, the read data is compared against the known data pattern. At block 1012, if the test failed, the selected analysis interface's settings contributed to the original fail and therefore a fail edge has been found for the interface, then the process passes to block 1014. Block 1014 illustrates identifying a current analysis signal edge, and the process passes to block 1016. Returning to block 1012, if the test does not fail, then the process passes to block 1016.

Block 1016 illustrates a determination whether all non-alert fail signals are tested. If not all non-alert fail signals are tested, then the process returns to block 1004. If all non-alert fail signals are tested, then the process ends.

Figure 11:
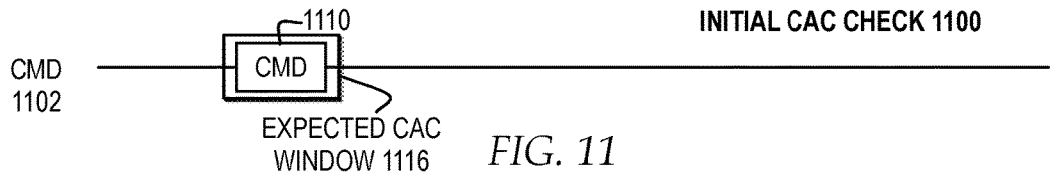
FIG. 11 illustrates one example of a timing diagram of an initial CAC check, allowing for a CAC delay that passes.

FIG. 11 illustrates one example of a timing diagram of an initial CAC check, allowing for a CAC delay that passes. In one example, a timing diagram of an initial CAC check 1100 includes time frames for a command (CMD) 1102. In the example, a time frame for CMD 1102 illustrates a CAC CMD 1110 issued by CAC control 125, delayed by a programmable CAC setting 120 that is initially set to an initial, nominal setting. In the example, CAC CMD 1110 may represent a read command, a write command, or another type of command. In the example, an expected CAC window 1116 illustrates the window of time during which the CAC command is expected to be issued as set in CAC parameters 116. In the example in FIG. 3, because CAC CMD 1110 is sent within expected CAC window 1116, the initial CAC check passes and the CAC delay setting checked may be used as a "safe CAC" setting. In the example, if CAC CMD 1110 were not issued within CAC data window 1116, the configuration controller would perform a shmoo characterization, adjusting the CAC delay only, and determine whether the CAC check is still failing at the end. If the CAC check is still failing at the end, then an error is output and the calibration check is ended.

Figure 12:
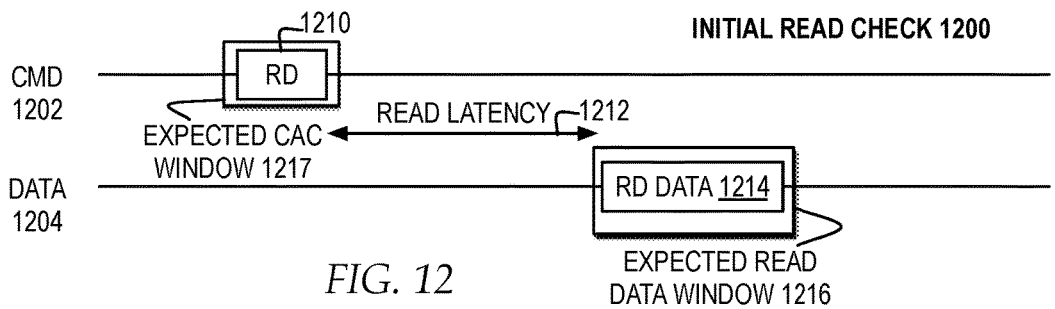
FIG. 12 illustrates one example of a timing diagram of an initial read check, allowing for a read delay that passes.

FIG. 12 illustrates one example of a timing diagram of an initial read check, allowing for a read delay that passes. In one example, a timing diagram of an initial read check 1200 includes time frames for a command (CMD) 1202 and data 1204. In the example, a time frame for CMD 1202 illustrates a read (RD) command 1210 issued by read control 124, delayed by a programmable RD setting 128 that is initially set to an initial, nominal delay setting. In the example, an expected CAC window 1217 illustrates the window of time during which the RD command 1210 is expected to be issued as set in CAC parameters 116. A time frame for data 1204 illustrates read control 124 receiving read data 1214 at a subsequent time after RD command 1210 is issued. In the example, there is a read latency 1212 between the issuance of RD command 1210 and the front edge of an expected read data window 1216. In the example, expected read data window 1216 illustrates the window of time during which the returned read data is expected as set in read parameters 114.

In the example in FIG. 12, because read data 1214 is received within expected read data window 1216, the initial read check passes and the read delay setting checked may be used as a "safe read" setting. In the example, if read data 1214 were not received within read data window 1216, the configuration controller would perform a shmoo characterization, adjusting the read delay only, and determine whether the read check is still failing at the end. If the read check is still failing at the end, then an error is output and the calibration check is ended.

In the example, in FIG. 12, by performing the initial read check, testing may require minimal time and bandwidth to determine a "safe read" setting. While FIG. 12 illustrates a single testing period, the minimized initial read check in FIG. 12 may be performed one or more times using one or more data patterns of multiple available data patterns in order to determine if the test passes or fails for the allowed read delay setting in programmable RD setting 128. For example, to further evaluate that an initial read check passes for a read delay setting, the read check may be re-read five or more times using multiple patterns for each read to further verify that a passing test is truly a passing test and to initially set the passing read delay as a safe setting for use during a subsequent simultaneous write and read calibration.

Figure 13:
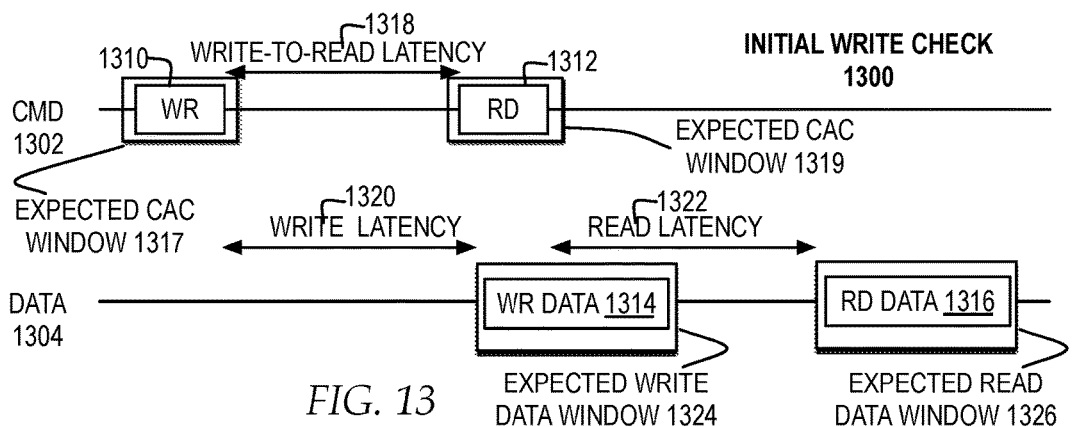
FIG. 13 illustrates one example of a timing diagram of an initial write check, allowing for a write delay that passes.

FIG. 13 illustrates one example of a timing diagram of an initial write check, allowing for a write delay that passes. In one example, a timing diagram of an initial write check 1300 includes time frames for a command (CMD) 1302 and data 1304. In the example, a time frame for CMD 1302 illustrates a write (WR) command 1310 issuance by write control 122, delayed by a programmable WR setting 126 that is initially set to an initial, nominal delay setting. A time frame for data 1304 illustrates write control 122 sending write data 1314 at a subsequent time after WR command 1310 is issued. In the example, an expected CAC window 1317 illustrates the window of time during which the WR command 1310 is expected to be issued as set in CAC parameters 116. In the example, there is a write latency 1320 between the issuance of WR command 1310 and the front edge of an expected write data window 1324. In the example, expected write data window 1324 illustrates the window of time during which the write data is expected to be sent as set in write parameters 112. In addition, for a write check, a RD command 1312 may be issued after WR command 1310 to read the data written by WR command 1310 and verify that the write was completed. In one example, there is a latency between the time when WR command 1310 is issued and RD command 1312 is issued, referred to as a write-to-read latency 1318. In the example, there is also a read latency 1322 between the time when RD command 1312 is issued and when the written data is read, as RD data 1316. In the example, RD data 1316 is received within an expected read data window 1326.

In the example in FIG. 13, because WR data 1314 is sent within expected write data window 1324, the initial write check passes and the write delay setting checked may be used as a "safe write" setting. In the example, if write data 1314 were not received within write data window 1324, the configuration controller would perform a shmoo characterization, adjusting the write delay only, and determine whether the write check is still failing at the end. If the write check is still failing at the end, then an error is output and the calibration check is ended.

In the example, in FIG. 13, by performing the initial write check, testing may require minimal time and bandwidth to determine a "safe write" setting. While FIG. 13 illustrates a single testing period, the minimized initial write check in FIG. 13 may be performed one or more times using one or more data patterns of multiple available data patterns in order to determine if the test passes or fails for the allowed write delay setting in programmable WR setting 126. For example, to further evaluate that an initial write check passes for a write delay setting, the write check may be re-read five or more times using multiple patterns for each write and read test to further verify that a passing test is truly a passing test and to initially set the passing write delay as a safe setting for use during a subsequent simultaneous write and read calibration.

Figure 14:
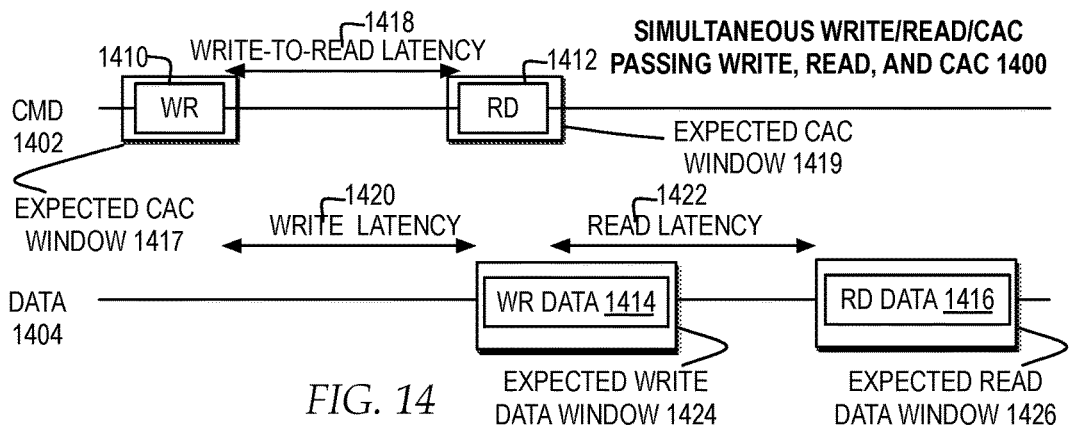
FIG. 14 illustrates one example of a timing diagram of a simultaneous write check, allowing a write delay, a read check, allowing a read delay, and CAC check, allowing a CAC delay, which passes.

FIG. 14 illustrates one example of a timing diagram of a simultaneous write check, allowing a write delay, a read check, allowing a read delay, and CAC check, allowing a CAC delay, which passes.

In one example, a timing diagram of a passing write, passing read, and passing CAC, result from a simultaneous, combined write, read and CAC test, with each of programmable WR setting 126, programmable RD setting 128, and programmable CAC setting 129 simultaneously set to delayed settings before the write, read, and CAC test is run, compared with write parameters 112, read parameters 114, and CAC parameters 116, includes time frames for a command (CMD) 1402 and data 1404. In the example, while in FIG. 13 a write, read, and CAC test is illustrated, in the initial check illustrated in FIG. 13, programmable WR setting 126, programmable RD setting 128, and programmable CAC setting 129, are not simultaneously set to nominal delayed settings before the read, write, and CAC test is run.

In the example, a time frame for CMD 1402 illustrates a WR command 1410 issued by write control 122, delayed by an adjusted programmable WR setting 126. A time frame for data 1404 illustrates write control 122 sending WR data 1414 at a subsequent time after write command 1410 is issued. In the example, an expected CAC window 1417 illustrates the window of time during which WR command 1410 is expected to be issued as set in CAC parameters 116. In the example, there is a write latency 1420 between the issuance of WR command 1410 and the front edge of an expected write data window 1424. In the example, expected write data window 1424 illustrates a horizontal position of the window of time during which WR data 1414 is expected to be sent as set in write parameters 112.

In addition, for the simultaneous write, read, and CAC check, a RD command 1412 may be issued by read control 124, delayed by an adjusted programmable RD setting 128, to read data. In the example, an expected CAC window 1419 illustrates the window of time during which RD command 1412 is expected to be issued as set in CAC parameters 116. In one example, there is latency between the time when WR command 1410 is issued and RD command 1412 is issued, referred to as a write-to-read latency 1418. In the example, there is also a read latency 1422 between the time when RD command 1412 is issued and when the written data is read, as RD data 1416.

In the example in FIG. 14, because the results of the simultaneous, combined write, read, and CAC test result in WR data 1414 writing within expected write data window 1424 RD data 1416 being read within expected read data window 1426, WR command 1410 being issued within expected CAC window 1417, and RD command 1412 being issued within expected CAC window 1419, the simultaneous write, read, and CAC test passes. While FIG. 14 illustrates a single testing period, the write, read, and CAC testing illustrated in FIG. 14 may be performed one or more times using one or more data patterns of multiple available data patterns in order to determine if the test passes or fails for the simultaneously set write delay setting in programmable WR setting 126, read delay setting in programmable RD setting 128, and CAC delay setting in programmable CAC settings 129. For example, to further evaluate that the write, read and CAC test passes for each of a write delay setting, a read delay setting, and a CAC delay setting, the write check may be re-read five or more times using multiple patterns for each write, read, and CAC test to further verify that a passing test is truly a passing test.

Figure 15:
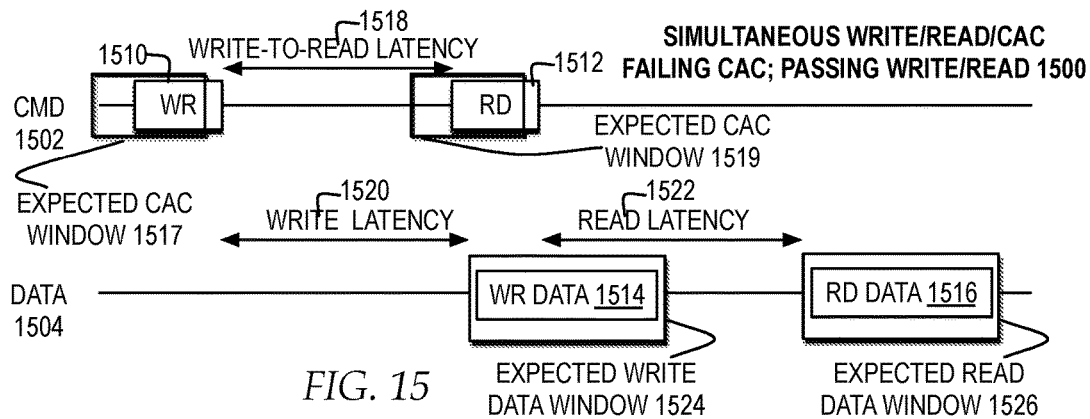
FIG. 15 illustrates one example of a timing diagram of a simultaneous CAC check, allowing a CAC delay, which fails, with a write check, allowing a write delay, and a read check, allowing a read delay, which both pass.

FIG. 15 illustrates one example of a timing diagram of a simultaneous CAC check, allowing a CAC delay, which fails, with a write check, allowing a write delay, and a read check, allowing a read delay, which both pass.

In one example, a timing diagram of a failing CAC and passing write and read result from a simultaneous, combined write, read, and CAC test, with programmable WR setting 126, programmable RD setting 128, and programmable CAC setting 129 each simultaneously set to delayed settings before the write, read, and CAC test is run, compared with write parameters 112, read parameters 114, and CAC parameters 116, includes time frames for a command (CMD) 1502 and data 1504. In the example, a time frame for CMD 1502 illustrates a WR command 1510 issued by write control 122, delayed by adjusted programmable WR setting 126. A time frame for data 1504 illustrates write control 122 sending WR data 1514 at a subsequent time after WR command 1510 is issued. In the example, an expected CAC window 1517 illustrates the window of time during which WR command 1510 is expected to be issued as set in CAC parameters 116. In the example, WR command 1510 is not issued within expected CAC window 1517.

In the example, there is a write latency 1520 between the issuance of WR command 1510 and the front edge of an expected write data window 1524. In the example, a horizontal position of expected write data window 1524 illustrates the window of time during which the write data is expected to be sent as set in write parameters 112. In addition, for the simultaneous write, read, and CAC check, a RD command 1512 may be issued by read control 124, delayed by adjusted programmable RD setting 128, to read data. In the example, an expected CAC window 1519 illustrates the window of time during which RD command 1512 is expected to be issued as set in CAC parameters 116. In the example, RD command 1512 is not issued within expected CAC window 1519. In one example, there is latency between the time when WR command 1510 is issued and RD command 1512 is issued, referred to as a write-to-read latency 1518. In the example, there is also a read latency 1522 between the time when RD command 1512 is issued and when the written data is read, as RD data 1516. In the example RD data 1616 arrives within expected read data window 1526.

In the example in FIG. 15, because the results of the simultaneous write, read, and CAC test result in WR command 1510 not issued within expected CAC window 1517 and RD command 1512 not issued within expected CAC window 1519, even though WR data 1514 is issued within expected write data window 1524 and RD data 1516 is read within expected read data window 1526, the simultaneous write, read, and CAC test fails. In particular, in the example, the CAC test is run simultaneously with the write test and read test by testing CAC delays of the write and read commands during the combined write and read test. In response to the CAC fail, the calibration controller may determine what caused the failure and find a horizontal CAC edge condition has occurred.

Figure 16:
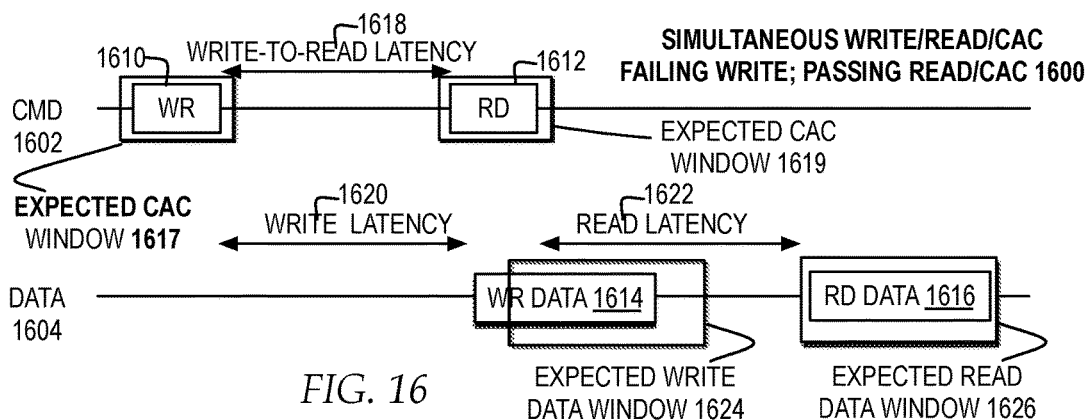
FIG. 16 illustrates one example of a timing diagram of a simultaneous write check, allowing a write delay, which fails, with a read check, allowing a read delay, and a CAC check, allowing a CAC delay, which both pass.

FIG. 16 illustrates one example of a timing diagram of a simultaneous write check, allowing a write delay, which fails, with a read check, allowing a read delay, and a CAC check, allowing a CAC delay, which both pass.

In one example, a timing diagram of a failing write and passing read and CAC result from a simultaneous, combined write, read, and CAC test, with programmable WR setting 126, programmable RD setting 128, and programmable CAC setting 129 each simultaneously set to delayed settings before the write, read, and CAC test is run, compared with write parameters 112, read parameters 114, and CAC parameters 116, includes time frames for a command (CMD) 1602 and data 1604. In the example, a time frame for CMD 1602 illustrates a WR command 1610 issued by write control 122, delayed by adjusted programmable WR setting 126. A time frame for data 1604 illustrates write control 122 sending WR data 1614 at a subsequent time after WR command 1610 is issued. In the example, an expected CAC window 1617 illustrates the window of time during which WR command 1610 is expected to be issued as set in CAC parameters 116. In the example, WR command 1610 is issued within expected CAC window 1617.

In the example, there is a write latency 1620 between the issuance of WR command 1610 and the front edge of an expected write data window 1624. In the example, a horizontal position of expected write data window 1624 illustrates the window of time during which the write data is expected to be sent as set in write parameters 112. In the example, WR data 1614 does not arrive within expected write data window 1624.

In addition, for the simultaneous write, read, and CAC check, a RD command 1612 may be issued by read control 124, delayed by adjusted programmable RD setting 128, to read data. In the example, an expected CAC window 1619 illustrates the window of time during which RD command 1612 is expected to be issued as set in CAC parameters 116. In the example, RD command 1612 is issued within expected CAC window 1619. In one example, there is latency between the time when WR command 1610 is issued and RD command 1612 is issued, referred to as a write-to-read latency 1618. In the example, there is also a read latency 1622 between the time when RD command 1612 is issued and when the written data is read, as RD data 1616. In the example RD data 1616 arrives within expected read data window 1626.

In the example in FIG. 16, because the results of the simultaneous write, read, and CAC test result in WR data 1614 not being issued within expected write data window 1624, even though WR command 1610 is issued within expected CAC window 1617, RD command 1612 is issued within expected CAC window 1619, and RD data 1616 is read within expected read data window 1626, the simultaneous write, read, and CAC test fails. In response to the write fail, the calibration controller may determine what caused the failure and find a horizontal write edge condition has occurred.

Figure 17:
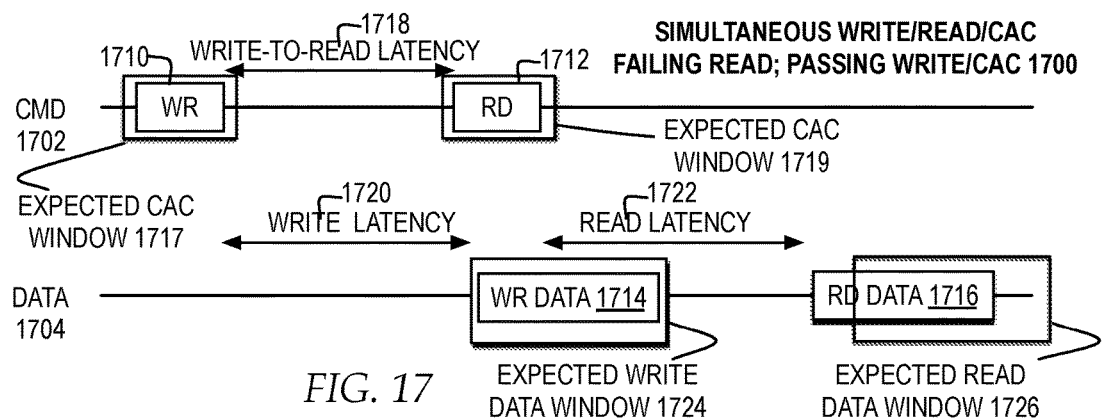
FIG. 17 illustrates one example of a timing diagram of a simultaneous read check, allowing a read delay which fails, and a write check, allowing a write delay which passes, and a CAC check, allowing a CAC delay which also passes.

FIG. 17 illustrates one example of a timing diagram of a simultaneous read check, allowing a read delay which fails, and a write check, allowing a write delay which passes, and a CAC check, allowing a CAC delay which also passes.

In one example, a timing diagram of a failing read and passing write and CAC result from a simultaneous, combined write, read, and CAC test, with programmable WR setting 126, programmable RD setting 128, and programmable CAC setting 129 each simultaneously set to delayed settings before the write, read, and CAC test is run, compared with write parameters 112, read parameters 114, and CAC parameters 116, includes time frames for a command (CMD) 1702 and data 1704. In the example, a time frame for CMD 1702 illustrates a WR command 1710 issued by write control 122, delayed by adjusted programmable WR setting 126. A time frame for data 1704 illustrates write control 122 sending WR data 1714 at a subsequent time after WR command 1710 is issued. In the example, an expected CAC window 1717 illustrates the window of time during which WR command 1710 is expected to be issued as set in CAC parameters 116. In the example, WR command 1710 is issued within expected CAC window 1717.

In the example, there is a write latency 1720 between the issuance of WR command 1710 and the front edge of an expected write data window 1724. In the example, a horizontal position of expected write data window 1724 illustrates the window of time during which the write data is expected to be sent as set in write parameters 112. In the example, WR data 1714 arrives within expected write data window 1724.

In addition, for the simultaneous write, read, and CAC check, a RD command 1712 may be issued by read control 124, delayed by adjusted programmable RD setting 128, to read data. In the example, an expected CAC window 1719 illustrates the window of time during which RD command 1712 is expected to be issued as set in CAC parameters 116. In the example, RD command 1712 is issued within expected CAC window 1719. In one example, there is latency between the time when WR command 1710 is issued and RD command 1712 is issued, referred to as a write-to-read latency 1718. In the example, there is also a read latency 1722 between the time when RD command 1712 is issued and when the written data is read, as RD data 1716. In the example RD data 1716 does not arrive within expected read data window 1726.

In the example in FIG. 17, because the results of the simultaneous write, read, and CAC test result in RD data 1716 not being issued within expected read data window 1726, even though WR command 1710 is issued within expected CAC window 1717, RD command 1712 is issued within expected CAC window 1719, and WR data 1714 is issued within expected write data window 1724, the simultaneous write, read, and CAC test fails. In response to the read fail, the calibration controller may determine what caused the failure and find a horizontal read edge condition has occurred.

Figure 18:
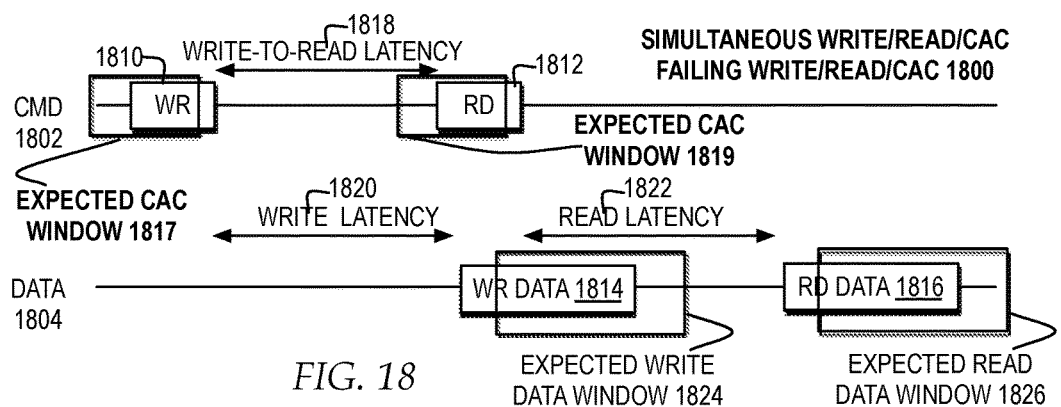
FIG. 18 illustrates one example of a timing diagram of a simultaneous read check, allowing a read delay, with a write check, allowing a write delay, and a CAC check, allowing a CAC delay, which all fail.

FIG. 18 illustrates one example of a timing diagram of a simultaneous read check, allowing a read delay, with a write check, allowing a write delay, and a CAC check, allowing a CAC delay, which all fail.

In one example, a timing diagram of a failing read, write and CAC result from a simultaneous, combined write, read, and CAC test, with programmable WR setting 126, programmable RD setting 128, and programmable CAC setting 129 each simultaneously set to delayed settings before the write, read, and CAC test is run, compared with write parameters 112, read parameters 114, and CAC parameters 116, includes time frames for a command (CMD) 1802 and data 1804. In the example, a time frame for CMD 1802 illustrates a WR command 1810 issued by write control 122, delayed by adjusted programmable WR setting 126. A time frame for data 1804 illustrates write control 122 sending WR data 1814 at a subsequent time after WR command 1810 is issued. In the example, an expected CAC window 1817 illustrates the window of time during which WR command 1810 is expected to be issued as set in CAC parameters 116. In the example, WR command 1810 is not issued within expected CAC window 1817.

In the example, there is a write latency 1820 between the issuance of WR command 1810 and the front edge of an expected write data window 1824. In the example, a horizontal position of expected write data window 1824 illustrates the window of time during which the write data is expected to be sent as set in write parameters 112. In the example, WR data 1814 does not arrive within expected write data window 1824.

In addition, for the simultaneous write, read, and CAC check, a RD command 1812 may be issued by read control 124, delayed by adjusted programmable RD setting 128, to read data. In the example, an expected CAC window 1819 illustrates the window of time during which RD command 1812 is expected to be issued as set in CAC parameters 116. In the example, RD command 1812 is not issued within expected CAC window 1819. In one example, there is latency between the time when WR command 1810 is issued and RD command 1812 is issued, referred to as a write-to-read latency 1818. In the example, there is also a read latency 1822 between the time when RD command 1812 is issued and when the written data is read, as RD data 1816. In the example RD data 1816 does not arrive within expected read data window 1826.

In the example in FIG. 18, because the results of the simultaneous write, read, and CAC test result in WR command 1810 not being issued within expected CAC window 1817, RD command 1812 not being issued within expected CAC window 1819, WR data 1814 not being issued within expected write data window 1824, and RD data 1816 not being issued within expected read data window 1826, because the simultaneous write, read, and CAC test fails. In response to the read, write, and CAC fail, the calibration controller may determine what caused the failure and find each of a horizontal read, write and CAC edge condition has occurred.

Figure 19:
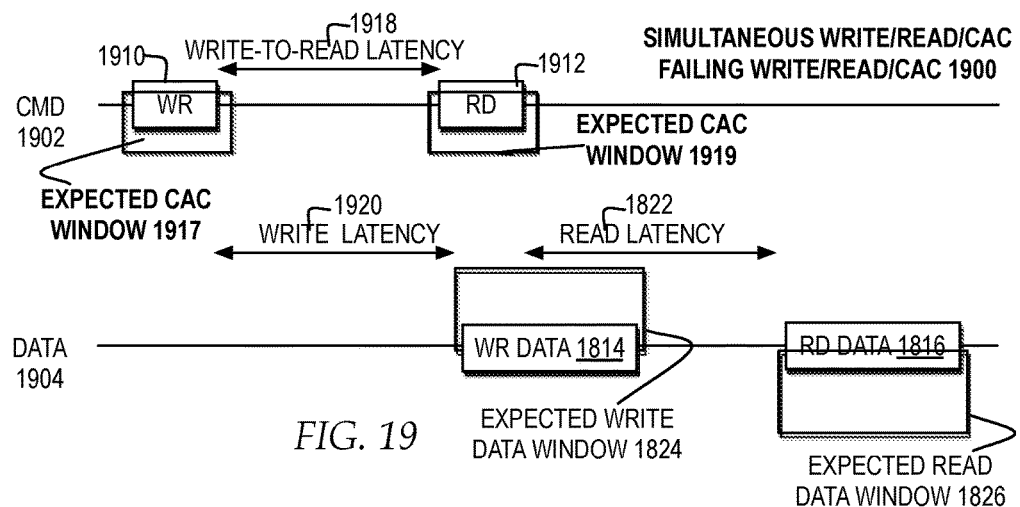
FIG. 19 illustrates one example of a timing diagram of a simultaneous read check, allowing a VREF setting, with a write check, allowing a VREF setting, and a CAC check, allowing a VREF setting, which all fail.

FIG. 19 illustrates one example of a timing diagram of a simultaneous read check, allowing a VREF setting, with a write check, allowing a VREF setting, and a CAC check, allowing a VREF setting, which all fail.

In one example, a timing diagram of a failing write, read and CAC result from a simultaneous, combined write, read and CAC test, with programmable WR setting 126, programmable RD setting 128, and programmable CAC setting 129 each simultaneously set to VREF settings before the write, read, and CAC test is run, compared with write parameters 112, read parameters 114, and CAC parameters 116, includes time frames for a command (CMD) 1902 and data 1904. In the example, a time frame for CMD 1902 illustrates a write command 1910 issued by write control 122, delayed by adjusted programmable WR setting 126. A time frame for data 1904 illustrates write control 122 sending write data 1914 at a subsequent time after write command 1910 is issued. In the example, an expected CAC window 1917 illustrates the window of time during which WR command 1910 is expected to be issued as set in CAC parameters 116.

In the example, there is a write latency 1920 between the issuance of write command 1910 and the front edge of an expected write data window 1924. In the example, the horizontal positioning of expected write data window 1924 illustrates the window of time during which the write data is expected to be sent as set in write parameters 112 and the horizontal position of expected read data window 1926 illustrates the window of time during which the read data is expected to be read as set in read parameters 114. In addition, for the simultaneous write, read, and CAC check, a read command 1912 may be issued by read control 124, delayed by adjusted programmable RD setting 128, to read data. In one example, there is latency between the time when write command 1910 is issued and read command 1912 is issued, referred to as a write-to-read latency 1918. In the example, there is also a read latency 1922 between the time when read command 1912 is issued and when the written data is read, as read data 1916.

In addition, the vertical position of expected CAC window 1917 illustrates the centering of the voltage reference levels expected between output swing levels for a CAC command and the vertical position of expected CAC window 1919 illustrates the centering of the voltage reference levels expected between output swing levels for a next CAC command. In addition, the vertical positioning of expected write data window 1924 illustrates the centering of the voltage reference levels expected between output swing levels for write data and the vertical positioning of expected read data window 1926 illustrates the centering of the voltage reference levels expected between output swing levels for read data.

In the example in FIG. 19, the results of the simultaneous write, read, and CAC test result in WR command 1910 horizontally within expected CAC window 1917, but vertically, WR command 1910 is not centered within expected CAC window 1917, therefore the CAC test fails. In addition, RD command 1912 is horizontally within expected CAC window 1919, but vertically, RD command 1912 is not centered within expected CAC window 1919, therefore the CAC test fails. In addition, write data 1914 is horizontally written within expected write data window 1924, but vertically, write data 1914 is not centered within expected write data window 1924, therefore the write test fails. In addition, read data 1916 is horizontally read within expected read data window 1926, but vertically, read data 1916 is not centered within expected read data window 1926, therefore the read test fails. In response to the CAC, write, and read fails, the calibration controller may determine what caused the failure and find each of a vertical CAC edge, a vertical write edge, and a vertical read edge condition has occurred.

The flowchart and block diagrams in the Figures illustrate the architecture, functionality, and operation of possible implementations of systems, methods and computer program products according to various embodiments of the present invention. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, occur substantially concurrently, or the blocks may sometimes occur in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising", when used in this specification specify the presence of stated features, integers, steps, operations, elements, and/or components, but not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the one or more embodiments of the invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

While the invention has been particularly shown and described with reference to one or more embodiments, it will be understood by those skilled in the art that various changes in form and detail may be made therein without departing from the spirit and scope of the invention.

What is claimed is:

1. A method comprising:
   testing an electronic circuit to identify an initial read check with a read delay, an initial write check with a write delay, and an initial command, address, control (CAC) check with a CAC delay indicated as passing; and
   responsive to the initial read check, the initial write check, and the initial CAC check indicated as passing, for each setting of the read delay, the write delay, and the CAC delay, iteratively performing concurrently, a write test with the write delay, a read test with the read delay, and a CAC test with the CAC delay on the electronic circuit over a plurality of types of conditions while simultaneously adjusting the write delay, the read delay, and the CAC delay for each iteration of a plurality of iterations of the concurrent read test, write test, and CAC test until one or more of a read edge, a write edge, and a CAC edge are detected.

2. The method according to claim 1, further comprising:
   adjusting each condition of the plurality of types of conditions over of a plurality of settings comprising each of a plurality of voltage settings, a plurality of reference voltage settings, a plurality of slew rate settings, a plurality of driver impedance settings, a plurality of receiver impedance settings, a plurality of frequency settings, a plurality of timing parameter settings, and a plurality of temperature refresh rate settings while calibrating a first value set as the write delay, a second value set as the read delay, and a third value set as the CAC delay.

3. The method according to claim 1, further comprising:
   responsive to passing the initial read check, the initial write check, and the initial CAC check, iteratively performing the write test with the write delay of a write timing delay setting concurrently with the read test with the read delay of a read timing delay and the CAC test with the CAC delay of a CAC timing delay setting over the plurality of types of conditions on the electronic circuit while simultaneously adjusting the write delay, adjusting the read delay, and adjusting the CAC delay for each iteration until one or more of a horizontal edge of the read edge, a horizontal edge of the write edge, and a horizontal edge of the CAC edge are detected.

4. The method according to claim 1, further comprising:
   responsive to passing the initial read check, the initial write check, and the initial CAC check, iteratively performing the write test with the write delay of a write voltage reference setting concurrently with the read test with the read delay of a read voltage reference and the CAC test with the CAC delay of a CAC voltage reference setting over the plurality of types of conditions on the electronic circuit while simultaneously adjusting the write delay, adjusting the read delay, and adjusting the CAC delay for each iteration until one or more of a vertical edge of the read edge, a vertical edge of the write edge, and a vertical edge of the CAC edge are detected.

5. The method according to claim 1, further comprising:
   iteratively performing concurrently, the write test with the write delay, the read test with the read delay, and the CAC test with the CAC delay on the electronic circuit over the plurality of conditions while simultaneously adjusting the write delay, the read delay, and the CAC delay for each iteration until the read edge, the write edge, and the CAC edge are detected for each condition of the plurality of types of conditions; and
   identifying, from the read edge, the write edge, and the CAC edge detected for each condition of the plurality of types of conditions, a calibrated delay value for each of the write delay, the read delay, and the CAC delay for the plurality of types of conditions to adjust the signal delays for each of write data, read data, and CAC data signal to arrive for latching within a separate valid window of time.

6. The method according to claim 1, further comprising:
   adjusting the write delay for adjusting the writing timing on a write interface between a memory controller and a memory of the electronic circuit; a
   adjusting the read delay for adjusting the read timing on a read interface between the memory controller and the memory of the electronic circuit; and
   adjusting the CAC delay for adjusting the CAC timing on a CAC interface between the memory controller and the memory of the electronic circuit.

7. The method according to claim 1, further comprising:
   checking read check results of the separate initial read check against one or more read parameters specified for read timing within the electronic circuit, wherein the one or more read parameters specify whether the initial read check results pass or fail;
   checking write check results of the separate initial write check against one or more write parameters specified for write timing within the electronic circuit, wherein the one or more write parameters specify whether the initial write check results pass or fail;
   checking CAC check results of the separate initial CAC check against one or more CAC parameters specified for CAC timing within the electronic circuit, wherein the one or more CAC parameters specify whether the initial CAC check results pass or fail; and
   checking combined results of the concurrent write test, read test, and CAC test against the one or more write parameters, the one or more read parameters, and the one or more CAC parameters.

8. The method according to claim 1, further comprising:
responsive to a particular iteration of the plurality of iterations of the concurrent read test, write test, and CAC test resulting in a failed test from a testing failure of one or more of the concurrent read test, write test, and CAC test, accessing one or more of a command address (CA) parity error signal, a write data cyclic redundancy cycle (CRC) error signal, and a read data CRC error signal to determine which of one or more settings under test from among the read delay, the write delay and the CAC delay caused the failed test; and
applying the one or more of the CA parity error signal and the CRC error signal to determine the one or more of the read edge, the write edge, and the CAC edge are detected.

9. The method according to claim 8, further comprising:
identifying the CRC error signal in an alert signal comprising a write CRC error signal in order to detect that the write delay under the write test caused the failed test.

10. The method according to claim 8, further comprising:
identifying the CRC error signal in an alert signal comprising a read CRC error signal in order to detect that the read delay under the read test caused the failed test.

11. The method according to claim 8, further comprising:
identifying the CA parity error signal in an alert signal in order to detect that the CAC delay under the CAC test caused the failed test.

12. The method according to claim 1, further comprising:
responsive to detecting the combined results of the simultaneous write test, read test, and CAC test fail:
    returning the CAC delay setting to a safe setting that has previously passed testing for one or more CAC parameters; and
    rereading updated combined results of the simultaneous write test, read test, and CAC test with the CAC delay set to the safe setting;
checking updated combined results of the simultaneous write test, read test, and CAC test against one or more write parameters, one or more read parameters, and one or more CAC parameters;
responsive to detecting the updated combined results of the simultaneous write test, read test, and CAC test pass, detecting the CAC edge; and
responsive to detecting the updated combined results of the simultaneous write test, read test, and CAC test fail, performing at least one test to identify whether the read delay setting or the write delay setting caused the updated combined results to fail.

13. The method according to claim 1, wherein testing an electronic circuit to identify an initial read check with a read delay setting, an initial write check with a write delay setting, and an initial command, address, control (CAC) check with a CAC delay setting indicated as passing further comprises:
    updating and testing each of the read delay setting, the write delay setting, and the CAC delay setting individually and until settings that result in a passing calibration test are identified for the read delay setting, the write delay setting, the CAC delay setting, a read voltage reference, a write voltage reference, a CAC voltage reference, a driver impedance and a slew rate.

14. A computer system comprising one or more processors, one or more computer-readable memories, one or more computer-readable storage devices, and program instructions, wherein the one or more computer-readable storage devices are not a transitory signal per se, stored on at least one of the one or more storage devices for execution by at least one of the one or more processors via at least one of the one or more memories, the stored program instructions comprising:
    program instructions to test an electronic circuit to identify an initial read check with a read delay, an initial write check with a write delay, and an initial command, address, control (CAC) check with a CAC delay indicated as passing; and
    program instructions to, responsive to the initial read check, the initial write check, and the initial CAC check indicated as passing, for each setting of the read delay, the write delay, and the CAC delay, iteratively perform concurrently, a write test with the write delay, a read test with the read delay, and a CAC test with the CAC delay on the electronic circuit over a plurality of types of conditions while simultaneously adjusting the write delay, the read delay, and the CAC delay for each iteration of a plurality of iterations of the concurrent read test, write test, and CAC test until one or more of a read edge, a write edge, and a CAC edge are detected.

15. The computer system according to claim 14, the stored program instructions further comprising:
    program instructions to, responsive to a particular iteration of the plurality of iterations of the concurrent read test, write test, and CAC test resulting in a failed test from a testing failure of one or more of the concurrent read test, write test, and CAC test, access one or more of a command address (CA) parity error signal, a write data cyclic redundancy cycle (CRC) error signal, and a read data CRC error signal to determine which of one or more settings under test from among the read delay, the write delay and the CAC delay caused the failed test; and
    program instructions to apply the one or more of the CA parity error signal and the CRC error signal to determine the one or more of the read edge, the write edge, and the CAC edge are detected.

16. The computer system according to claim 14, the stored program instructions further comprising:
    program instructions to, responsive to detecting the combined results of the simultaneous write test, read test, and CAC test fail:
        return the CAC delay setting to a safe setting that has previously passed testing for one or more CAC parameters; and
        reread updated combined results of the simultaneous write test, read test, and CAC test with the CAC delay set to the safe setting;
    program instructions to check updated combined results of the simultaneous write test, read test, and CAC test against one or more write parameters, one or more read parameters, and one or more CAC parameters;
    program instructions to, responsive to detecting the updated combined results of the simultaneous write test, read test, and CAC test pass, detect the CAC edge; and
    program instructions to, responsive to detecting the updated combined results of the simultaneous write test, read test, and CAC test fail, perform at least one test to identify whether the read delay setting or the write delay setting caused the updated combined results to fail.

17. The computer system according to claim 14, the stored program instructions to test an electronic circuit to identify an initial read check with a read delay setting, an initial write check with a write delay setting, and an initial command, address, control (CAC) check with a CAC delay setting indicated as passing further comprising:
   program instructions to update and testing each of the read delay setting, the write delay setting, and the CAC delay setting individually and until settings that result in a passing calibration test are identified for the read delay setting, the write delay setting, the CAC delay setting, a read voltage reference, a write voltage reference, a CAC voltage reference, a driver impedance and a slew rate.

18. A computer program product comprising one or more computer-readable storage devices and program instructions, stored on at least one of the one or more computer-readable storage devices, wherein the one or more computer-readable storage devices are not a transitory signal per se, the stored program instructions comprising:
   program instructions to test an electronic circuit to identify an initial read check with a read delay, an initial write check with a write delay, and an initial command, address, control (CAC) check with a CAC delay indicated as passing; and
   program instructions to, responsive to the initial read check, the initial write check, and the initial CAC check indicated as passing, for each setting of the read delay, the write delay, and the CAC delay, iteratively perform concurrently, a write test with the write delay, a read test with the read delay, and a CAC test with the CAC delay on the electronic circuit over a plurality of types of conditions while simultaneously adjusting the write delay, the read delay, and the CAC delay for each iteration of a plurality of iterations of the concurrent read test, write test, and CAC test until one or more of a read edge, a write edge, and a CAC edge are detected.

19. The computer program product according to claim 18, the stored program instructions further comprising:
   program instructions to, responsive to a particular iteration of the plurality of iterations of the concurrent read test, write test, and CAC test resulting in an a failed test from a testing failure of one or more of the concurrent read test, write test, and CAC test, access one or more of a command address (CA) parity error signal, a write data cyclic redundancy cycle (CRC) error signal, and a read data CRC error signal to determine which of one or more settings under test from among the read delay, the write delay and the CAC delay caused the failed test; and
   program instructions to apply the one or more of the CA parity error signal and the CRC error signal to determine the one or more of the read edge, the write edge, and the CAC edge are detected.

20. The computer program product according to claim 18, the stored program instructions further comprising:
   program instructions to, responsive to detecting the combined results of the simultaneous write test, read test, and CAC test fail:
      return the CAC delay setting to a safe setting that has previously passed testing for one or more CAC parameters; and
      reread updated combined results of the simultaneous write test, read test, and CAC test with the CAC delay set to the safe setting;
   program instructions to check updated combined results of the simultaneous write test, read test, and CAC test against one or more write parameters, one or more read parameters, and one or more CAC parameters;
   program instructions to, responsive to detecting the updated combined results of the simultaneous write test, read test, and CAC test pass, detect the CAC edge; and
   program instructions to, responsive to detecting the updated combined results of the simultaneous write test, read test, and CAC test fail, perform at least one test to identify whether the read delay setting or the write delay setting caused the updated combined results to fail.

* * * * *